US010521521B2

(12) United States Patent
Boys et al.

(10) Patent No.: US 10,521,521 B2
(45) Date of Patent: Dec. 31, 2019

(54) SHARED REPOSITORY OF SIMULATION MODELS

(71) Applicant: AVEVA Software, LLC, Lake Forest, CA (US)

(72) Inventors: Ian H. Boys, Vista, CA (US); Douglas Paul Kane, Silverado, CA (US); David H. Jerome, La Habra, CA (US); Cal Depew, Irvine, CA (US)

(73) Assignee: AVEVA SOFTWARE, LLC, Lake Forest, CA (US)

( * ) Notice: Subject to any disclaimer, the term of this patent is extended or adjusted under 35 U.S.C. 154(b) by 972 days.

(21) Appl. No.: 14/231,341

(22) Filed: Mar. 31, 2014

(65) Prior Publication Data
US 2015/0106073 A1   Apr. 16, 2015

Related U.S. Application Data

(60) Provisional application No. 61/890,730, filed on Oct. 14, 2013.

(51) Int. Cl.
*G06F 17/50* (2006.01)
(52) U.S. Cl.
CPC ............... *G06F 17/5009* (2013.01)
(58) Field of Classification Search
CPC ...... G06F 17/5009; G05B 2219/32017; G05B 17/02
USPC ................................... 703/2, 6, 9
See application file for complete search history.

(56) References Cited

U.S. PATENT DOCUMENTS

| 5,666,297 A * | 9/1997 | Britt .................. G06F 17/12 700/286 |
| 6,205,465 B1 * | 3/2001 | Schoening ............. G06F 8/456 709/223 |
| 6,442,512 B1 * | 8/2002 | Sengupta ............. G06F 9/4443 703/2 |
| 6,442,515 B1 * | 8/2002 | Varma ................... G06F 8/38 700/28 |
| 6,983,227 B1 * | 1/2006 | Thalhammer-Reyero .................. G05B 17/02 703/2 |
| 7,257,451 B2 * | 8/2007 | Carpency ............... F25J 3/0219 700/28 |
| 8,396,695 B2 * | 3/2013 | Kelly .................. G06Q 10/067 700/29 |
| 9,600,242 B2 * | 3/2017 | Gella ..................... G06F 8/20 |
| 10,038,670 B2 * | 7/2018 | Al-Khabbaz ....... H04L 63/0209 |

(Continued)

FOREIGN PATENT DOCUMENTS

WO   WO-0101206 A2 *   1/2001   ............. G05B 17/02

OTHER PUBLICATIONS

Peter C. Piela , "Ascend: an object-oriented computer environment for modeling and analysis", 1990, pp. 1-42.*

(Continued)

*Primary Examiner* — Juan C Ochoa
(74) *Attorney, Agent, or Firm* — Greenberg Traurig, LLP

(57) ABSTRACT

A system simulates a process entity. Software instructions stored on a memory device and executable by a processor create a plurality of entity type objects that generically represents a type of process entity. Instructions store the plurality of entity type objects in a shared repository. Additionally, instructions enable a plurality of users to access the plurality of entity type objects in the shared repository simultaneously.

20 Claims, 30 Drawing Sheets

(56) References Cited

U.S. PATENT DOCUMENTS

| | | | |
|---|---|---|---|
| 2005/0187745 A1* | 8/2005 | Lurie | G06F 19/12 703/11 |
| 2008/0189679 A1* | 8/2008 | Rodriguez | G06F 8/34 717/105 |
| 2011/0131017 A1* | 6/2011 | Cheng | G05B 19/41885 703/2 |
| 2013/0204587 A1* | 8/2013 | Cheng | G05B 17/02 703/2 |
| 2014/0163944 A1* | 6/2014 | Jiang | G06Q 30/00 703/13 |

OTHER PUBLICATIONS

Shacham et al., "Review Equation oriented approach to process flowsheeting", 1982, Computers & Chemical Engineering 6.2, pp. 79-95.*

Kirk Andre Abbott, "Very Large Scale Modeling", 1996, Diss. Carnegie-Mellon University, pp. 1-166.*

Richard M. Fujimoto, Parallel and Distributed Simulation, 1999, Proceedings of the 1999 Winter Simulation Conference, pp. 122-131.*

Richard M. Fujimoto, "Parallel discrete event simulation", 1990, Communications of the ACM 33.10, pp. 30-53.*

William K. McQuay, "Distributed collaborative environments for 21st century modeling and simulation", Sep. 19, 2001, Proc. SPIE 4367, Enabling Technology for Simulation Science V, doi: 10.1117/12.440017, pp. 164-173.*

Biegler et al., Life Cycle Analysis with Structured Uncertainty for the Synthesis of Process Flowsheets, 2002, Carnegie Mellon University, No. DOE/ER/14875-1, pp. 1-7.*

* cited by examiner

Table 5

| Equations \ Variables | 11 | 9 | 2 | 4 | 5 | 1 | 3 | 10 | 7 | 6 | 8 |
|---|---|---|---|---|---|---|---|---|---|---|---|
| 6 | X | X | X |   |   |   |   |   |   |   | X |
| 8 | X | X | X | X | X |   | X |   |   |   |   |
| 5 |   |   | X |   | X |   |   | X | X | X |   |
| 11 |   |   |   |   |   | X |   |   | X | X |   |
| 9 |   |   |   |   |   |   | X | X |   |   | X |
| 2 |   |   |   |   |   | X | X | X |   |   |   |
| 3 |   |   |   |   |   | X |   |   | X |   |   |
| 4 |   |   |   |   |   |   |   |   |   | X | X |
| 12 |   |   |   |   |   |   |   |   |   | X | X |
| 10 |   |   |   |   |   |   |   |   |   |   | X |
| 1 |   |   |   |   |   |   |   |   | X |   |   |
| 7 |   |   |   |   |   |   |   |   |   |   | X |

FIG. 29

Table 7

| Equations \ Variables | 1 | 2 | 3 | 4 | 5 | 6 | 7 | 8 | 9 | 10 |
|---|---|---|---|---|---|---|---|---|---|---|
| 1 | X |   |   |   |   |   | X | X |   | X |
| 2 | X | X | X | X |   |   | X | X | X | X |
| 3 |   |   | X |   |   |   | X |   |   |   |
| 4 | X | X | X | X |   |   | X | X |   |   |
| 9 | X | X | X | X | X | X |   | X | X | X |
| 6 |   |   | X | X | X |   | X | X |   | X |
| 7 |   |   | X |   |   |   | X |   |   |   |
| 8 | X |   |   |   |   |   | X | X |   | X |
| 5 | X | X | X | X | X |   |   | X | X | X |
| 10 | X |   | X |   |   |   |   |   |   | X |

FIG. 30

Table 8

| | | \multicolumn{10}{c}{Variables} |
|---|---|---|---|---|---|---|---|---|---|---|---|
| | | 3 | 7 | 1 | 8 | 10 | 2 | 4 | 6 | 9 | 5 |
| Equations | 3 | X | X | | | | | | | | |
| | 7 | X | X | | | | | | | | |
| | 1 | | X | X | X | X | | | | | |
| | 8 | | X | X | X | X | | | | | |
| | 10 | X | | X | | X | | | | | |
| | 2 | X | X | X | X | X | X | X | X | | |
| | 4 | X | X | X | X | | X | X | | | |
| | 6 | X | X | | X | X | X | X | X | | |
| | 5 | X | X | X | X | | X | X | | X | |
| | 9 | X | | X | X | X | X | X | X | X | X |

FIG. 31

Table 10

| | | Variables | | | | |
|---|---|---|---|---|---|---|
| | | 2 | 1 | 3 | 4 | 5 |
| Equations | 1 | X | | | | |
| | 2 | | X | X | | |
| | 5 | | | X | X | |
| | 4 | X | | | X | X |
| | 3 | | | X | | X |

FIG. 32

Table 12

| | | Variables | | | | | |
|---|---|---|---|---|---|---|---|
| | | 1 | 2 | 3 | 4 | 5 | 6 |
| Equations | 6 | X | | | | | X |
| | 4 | | X | | X | X | |
| | 2 | X | | X | | | |
| | 5 | | | X | X | | |
| | 3 | X | | | | X | |
| | 1 | | X | | | | X |

FIG. 33

SHARED REPOSITORY OF SIMULATION MODELS

CROSS REFERENCE TO RELATED APPLICATION

This application claims the benefit of U.S. Application Ser. No. 61/890,730, filed Oct. 14, 2013, the disclosure of which is hereby incorporated by reference in its entirety for all purposes.

BACKGROUND

Aspects of the present invention generally relate to the fields of networked computerized industrial control, automation systems and networked computerized systems utilized to monitor, log, and display relevant manufacturing/production events and associated data, and supervisory level control and manufacturing information systems. Such systems generally execute above a regulatory control layer in a process control system to provide guidance to lower level control elements such as, by way of example, programmable logic controllers or distributed control systems (DCSs). Such systems are also employed to acquire and manage historical information relating to such processes and their associated output. More particularly, aspects of the present invention relate to systems and methods for using tools employing calculations that are designed model and simulate the process in order to optimize the process. The use of these modeling and simulation functions allows a user to capture the economic benefit from processes such as refinery, chemical or petrochemical plant operations.

Industry increasingly depends upon highly automated data acquisition and control systems to ensure that industrial processes are run efficiently, safely and reliably while lowering their overall production costs. Data acquisition begins when a number of sensors measure aspects of an industrial process and periodically report their measurements back to a data collection and control system. Such measurements come in a wide variety of forms. By way of example, the measurements produced by a sensor/recorder include: a temperature, a pressure, a pH, a mass/volume flow of material, a tallied inventory of packages waiting in a shipping line, or a photograph of a room in a factory. Often sophisticated process management and control software examines the incoming data, produces status reports, and, in many cases, responds by sending commands to actuators/controllers that adjust the operation of at least a portion of the industrial process. The data produced by the sensors also allow an operator to perform a number of supervisory tasks including: tailor the process (e.g., specify new set points) in response to varying external conditions (including costs of raw materials), detect an inefficient/non-optimal operating condition and/or impending equipment failure, and take remedial actions such as move equipment into and out of service as required.

Typical industrial processes are extremely complex and receive substantially greater volumes of information than any human could possibly digest in its raw form. By way of example, it is not unheard of to have thousands of sensors and control elements (e.g., valve actuators) monitoring/controlling aspects of a multi-stage process within an industrial plant. These sensors are of varied type and report on varied characteristics of the process. Their outputs are similarly varied in the meaning of their measurements, in the amount of data sent for each measurement, and in the frequency of their measurements. As regards the latter, for accuracy and to enable quick response, some of these sensors/control elements take one or more measurements every second. Multiplying a single sensor/control element by thousands of sensors/control elements (a typical industrial control environment) results in an overwhelming volume of data flowing into the manufacturing information and process control system. Sophisticated data management and process visualization techniques have been developed to handle the large volumes of data generated by such system.

Due to this complexity, it is a difficult but vital task to ensure that the process is running efficiently. Although the modeling the process for the purpose of simulating it is known, the challenges involved in creating and using a simulation model of a process include ensuring the accuracy of the model and responsive performance of the simulation while running. Simulation of a process requires solving large systems of equations, which can be extremely time consuming.

SUMMARY

Aspects of the present invention involve a system that models the process for the purpose of simulating it accurately. The simulation can be used to locate any inefficiency in the current process and determine alterations that can improve or eliminate inefficiencies. Advantageously, aspects of the present invention ensure the accuracy of the model and responsive performance of the simulation while running. Moreover, such aspects facilitate the solving of large systems of equations.

In one aspect, a system simulates a process entity. Software instructions stored on a memory device and executable by a processor create a plurality of entity type objects, the entity type objects generically representing a type of process entity. Instructions store the plurality of entity type objects in a shared repository. Additionally, instructions enable a plurality of users to access the plurality of entity type objects in the shared repository simultaneously.

Software instructions stored on one or more tangible, non-transitory computer-readable media and executable by a processor embody further aspects of the invention. In yet another aspect, a processor executable method is provided.

Other objects and features will be in part apparent and in part pointed out hereinafter.

BRIEF DESCRIPTION OF THE DRAWINGS

FIGS. 27-28 illustrates a Dulmage-Mendelsohn decomposition table according to some embodiments.

FIG. 29 illustrates an interpretation of a Dulmage-Mendelsohn decomposition table according to some embodiments FIG. 30 illustrates a table with a partitioning step according to some embodiments.

FIG. 31 illustrates a table comprising sequence of row and column permutations according to some embodiments.

FIG. 32 illustrates a table comprising solution of the matrix according to some embodiments.

FIG. 33 illustrates a table comprising equations with analysis according to some embodiments.

Corresponding reference characters indicate corresponding parts throughout the drawings.

DETAILED DESCRIPTION

Aspects of the invention relate to a three-mode simulator software program capable of steady state mass and energy balances, fluid flow network analysis, and dynamic Simulation (Process, Fluid Flow, and Dynamics modes, respectively) within a single Simulation Model. Advantageously, the program is more powerful but easier to use than current specialized tools, and allows greater convenience and collaboration through new computing technology. The simulation program embodying aspects of the invention further allows engineers to design and share complex process simulation models. And the program allows the modification of existing Model Types and creation of custom Model Types for new processes, organizes Models in Model Libraries for sharing with other users, and defines Variables and Equations in Models that represent chemical process Models. Moreover, the simulation program embodying aspects of the invention stores Model Libraries, Simulations, and Units of Measure (UOM) slates in a Repository, allowing them to be shared among users.

Figure 1:
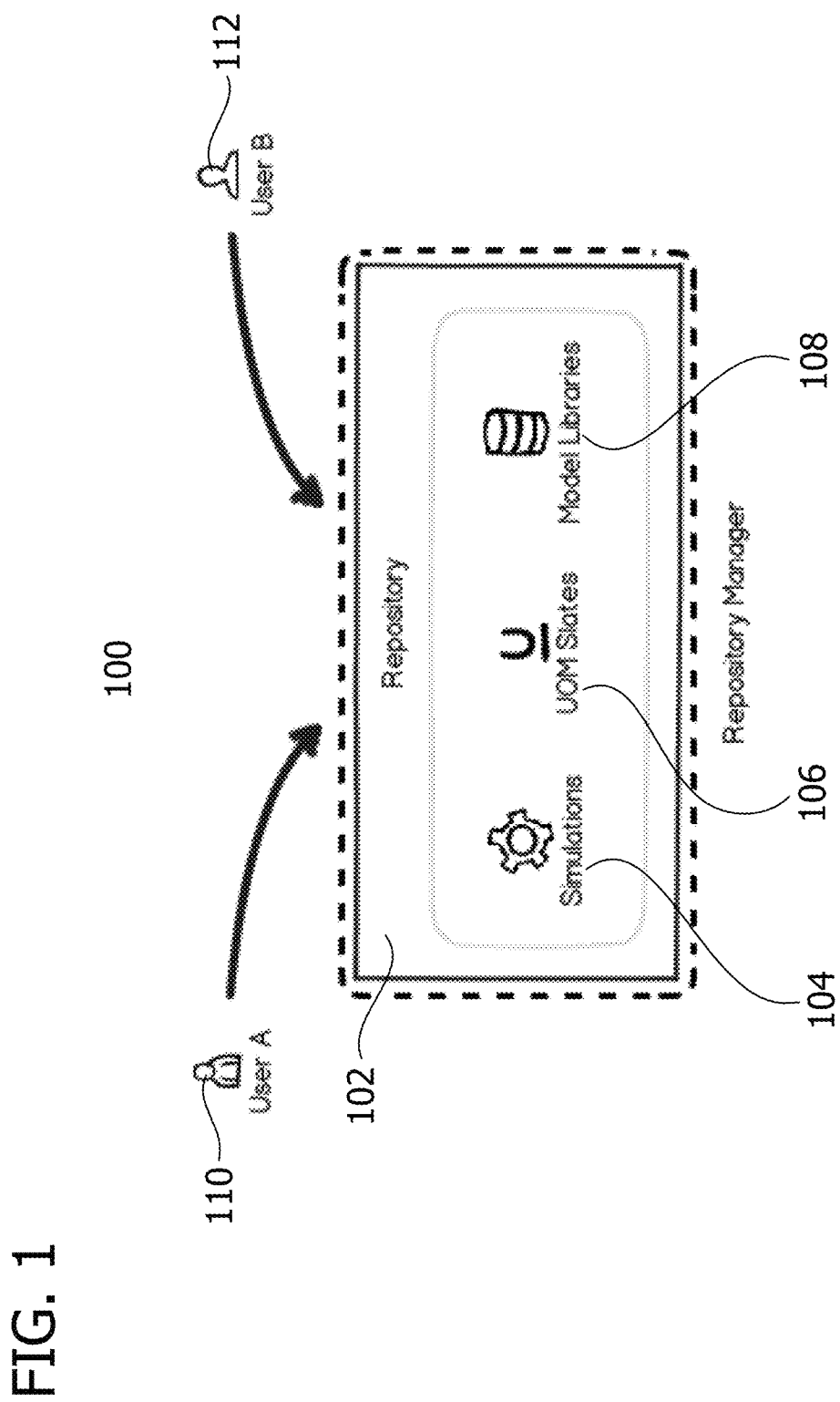
FIG. 1 is a diagram depicting a shared repository that stores models, simulations, and UOM (Units-of-Measure) slates according to an embodiment of the invention.

Referring first to a Repository feature according to an embodiment of the simulation program, FIG. 1 shows a diagram of a Repository Manager 100. The Repository 102 is where Simulations 104, Model Libraries 108, and UOM slates 106 are stored. The Repository 102 can be stored on a local machine, or on a shared server. The simulation program manages access to the Repository's Simulations 104 through the Repository Manager 100. The information housed in Repository 102 is current and always accessible by any users (User A, generally indicated at 110, and User B, generally indicated at 112) working within the same Repository 102.

Multiple users 110, 112 can access Repository 102 at the same time. And through the Repository 102, they can easily share information between each other having to do with the various entities (Simulations 104, Model Libraries 108, and UOM slates 106) that are stored on Repository 102. Preferably, changes that a user makes to an entity stored on Repository 102 are automatically persisted to the Repository 102 so that other interested users can make use of the newest version of the changed entity.

Because simulations 104 stored on Repository 102 are available to multiple users simultaneously, more than one user and users in different locations can work with the same simulation 104 simultaneously. This allows for easy collaboration between users, even if the users are in different locations.

The Repository 102 allows for users to import entities to and export entities from Repository 102. For instance, a user could export a newly created simulation 104 from Repository 102 for the purpose of sharing it with other users who are using a different Repository. In the same way, a user can receive a new entity from outside Repository 102 and import it into Repository 102 to allow all the users of that Repository 102 use of the new entity.

When a change is made to a Model or Simulation, it is automatically saved to the Repository. In addition to automatically saving work, the repository can also store Snapshots of a simulation and its objects created by a Snapshot Manager. A Snapshot is an archive of the state of the Simulation at a previous solution. It contains all Variable and Real Parameter values and the Variables' specification status. The Snapshot Manager can create a new Snapshot or return to a previous one. The Snapshot Manager is used to add a description to a Snapshot, rename a Snapshot, delete a Snapshot and more. When a Snapshot is created, it is saved with the Simulation.

Figure 2:
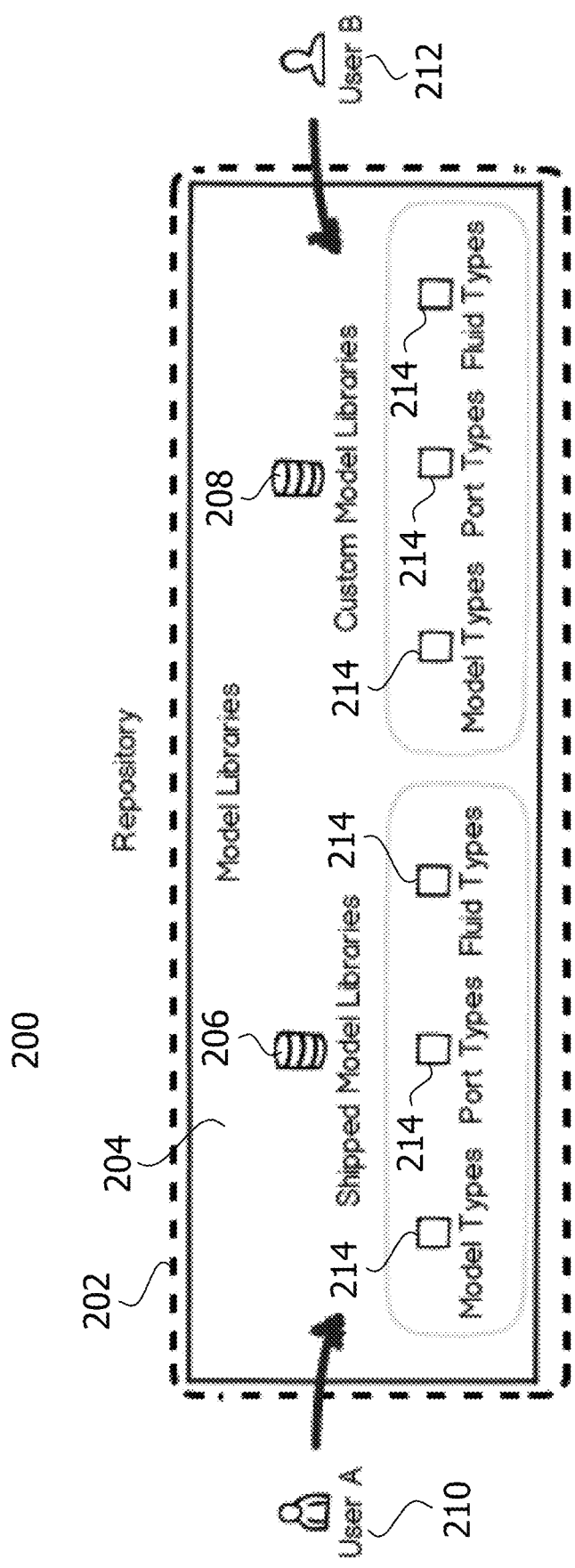
FIG. 2 is a diagram depicting model libraries within the shared repository of FIG. 1.

In FIG. 2, reference is made to a Model Library feature and a diagram 200 of the Model Libraries 204 within a Repository 202 is shown. The Model Library 204 is where Model, Fluid and Port Types 214 are stored. The Model Library 204 is housed within the Repository 202 on a shared server or on a local machine. Multiple people (e.g., User A, generally indicated at 210, and User B, generally indicated at 212) can access Model, Fluid and Port Types 214 from and save them to a Model Library 204 in a shared Repository 202. Model libraries 204 can be accessed to build a single Simulation 104. One of the key benefits of the Model Library 204 is that a user can work with other people to create and share custom, company-specific Model Types 214 that contain proprietary Equations. The information housed in Model Library 204 is current and always accessible by users working within the same Repository 202.

Model Types, Fluid Types, and Port Types 214 stored in the Model Libraries 204 behave as templates, or generic representations of the type of entity that they describe. Flowsheets are simulation objects and are defined only in simulations. Flowsheets are containers for instances of model types that the user creates when building a simulation. When a model is placed on a flowsheet an instance of the type is created. Every model instance stores its type. For instance type "Pump" would be found as a custom model inside the simulation (no prefix). However, type "SimSci.Pump" would be the standard Pump type in the Simsci library.

Model Libraries 204 normally are separate from simulations and live in the repository 202. The default library 206 that comes with the install is the "SimSci" library. This is where standard model types, port types, and fluid types 214 are stored. Libraries found in the repository will be known as Repository Libraries. Custom Model Libraries 208 can be created (by project teams or customers), imported, exported and shared between users. Each simulation also contains an internal model library. This is where model types private to a simulation can be defined. The internal model library is still considered a library, even though it is owned by the simulation.

Because the Model Library 204 is stored in Repository 202, it can be accessed by multiple users 210 and 212 simultaneously. A Shipped Model Library 206 may be populated with standard Model, Fluid, and Port types 214, or a user could create his or her own Custom Model Library 208 and populate it with custom created types 214.

The types 214 stored in Model Library 204 can be used to create a simulation, which is also stored on Repository 202. A user can make use of multiple Model Libraries 204 while creating a single simulation. This gives the user great flexibility in selecting the proper types to use in the simulation. A user can also copy Model, Fluid, or Port Types 214 from one Model Library 204 to another.

When a user edits a Model Type, Port Type, or Fluid Type 214 referenced by a Simulation, the changes are automatically saved to both Model Library 204 and Repository 202, and are immediately reflected in the Simulation. This allows a user to easily propagate changes throughout many simulations without having to make the change in each simulation.

The Repository 202 allows for users to import Model Libraries 204 to and export Model Libraries 204 from Repository 202. For instance, a user could export a newly created Model Library 204 from Repository 202 for the purpose of sharing it with other users who are using a different Repository. In the same way, a user can receive a new Model Library 204 from outside Repository 202 and import it into Repository 202 to allow all the users of that Repository 202 use of the new Model Library 204.

Figure 3:
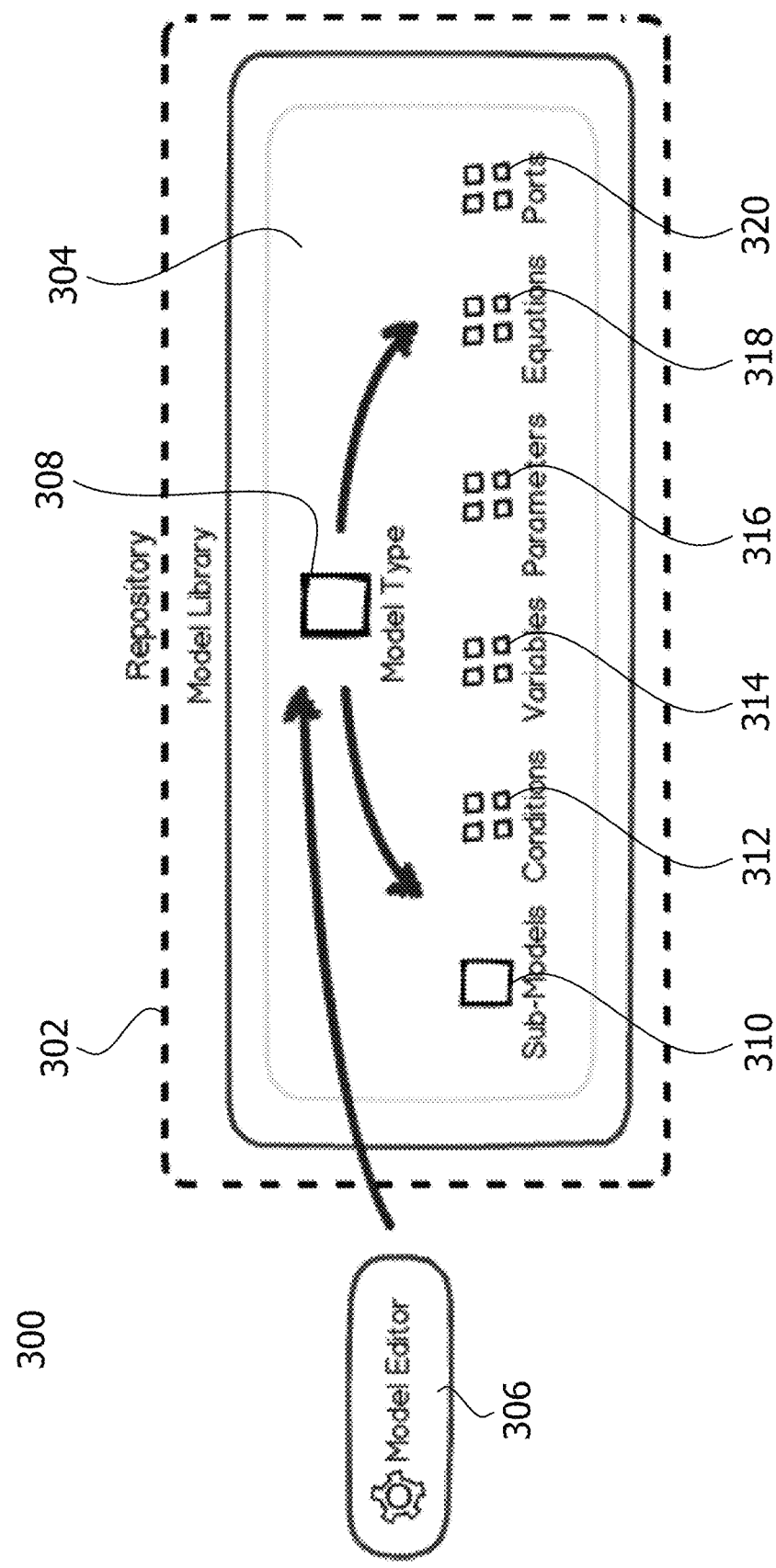
FIG. 3 is a diagram depicting the interaction between a model editor and a model type and the model library of FIG. 2.

FIG. 3 illustrates a Model Editor feature according to an embodiment of the invention. FIG. 3 shows the relationship between a Model Editor 306 and a Model Library 304. The Model Editor 306 is where a user creates and modifies Model Types 308 representing process equipment, controls, and other mathematical relationships. A user can create custom, company-specific Model Types 308 that include proprietary Equations 318 and save them to the Model Libraries 304 stored in a Repository 302. The Model Editor 306 is used to define Variables 314 and Equations 318 in Model Types 308 that represent chemical process Models.

The Model Editor 306 defines new Model Types 308 or edits existing Model Types 308 to fit specific requirements. Even standard Model Types 308 may be edited in this way, allowing for highly customizable Model Types 308.

A user can use the Model Editor 306 to build a hierarchy of Model Types 308, where complex Model Types 308 are built out of smaller Model Types by adding them as Submodels 310. This allows a user to create custom building blocks that can greatly increase the efficiency of building complex systems.

Because Model Types 308 created or edited with the Model Editor 306 are saved in Model Library 304 on the Repository 302, changes made to the Model Types 308 may be automatically saved to Repository 302 and propagated to all simulations that reference the changed Model Type 308 and are linked to the proper Repository 302 and Model Library 304.

The Model Type 308 created or edited in Model Editor 306 can be made up of a variety of data, including Sub-Models 310, conditions 312, variables 314, parameters 316, equations 318, and ports 320. Icons can be associated with Model Types 308 as well.

Conditions 312 cause the creation, non-creation, or removal of affected Variables, Equations, Models, and Ports. Furthermore, Conditions may be based on integer or enumerated Parameters and must evaluate to a Boolean. Before a Condition can be added, a user must first create an integer or enumerated Parameter. Conditions are evaluated when a Model Type is first placed on a Flowsheet, when a Parameter value is changed, and when a Model Type is modified in the Model Editor. By using Conditions in conjunction with Parameters, a user can create optional or configurable Model Type behavior.

When a new Condition is added to a Model Type or modify an existing one, a user writes a basic expression using conditional logic (equals, less than, greater than, less than or equal to, greater than or equal to, not equal, etc.). These groups of operators and functions are meant merely as examples and do not limit the use of operators and functions that are not listed.

A user can add a Variable 314 to a Model Type or Port Type in the Model Editor or Port Editor, associate a Condition with it, and specify it for particular Simulation Modes. Simulation Modes will be discussed in greater length below.

Choosing to specify a Variable for a particular Simulation Mode means that, when the system is solving an equation, that specified Variable is defined before solving the equation, rather than being solved for with the equation. This allows a user to determine how different Simulation Modes affect a Model Type and which variables need to be solved for in each Simulation Mode. Variables have a variable type that determines what the variable measures and what units of measure the variable uses.

A user can add Equations 318 to a Model Type to define mathematical relationships of variables within the Model. Equations mathematically represent the behavior of the entity that the Model is representing and the act of solving the equations based on the specified variables enables the system to accurately simulate the behavior of the actual system. When a new Equation is added to a Model Type or an existing Equation is modified, a user writes an expression using the mathematical operators (+, −, *, /, etc.) and a variety of other mathematical functions (exponential, absolute value, square root, etc.). Equations added to a Model Type can include time derivative equations so that the Model can simulate dynamic behavior. There are also a variety of mathematical functions that can be used (exponential, absolute value, square root, etc.). These groups of operators and functions are meant merely as examples and do not limit the use of operators and functions that are not listed A user can add a Model Type as a Submodel 310 of another Model Type 308. Submodels are beneficial as they provide the ability to create "template" Model Types that can be used as building blocks to create larger and more complicated Model Types.

A user can add a Parameter 316 to a Model or Port Type. The simulation program according to embodiments of the invention allows Integer, Real and Enumerated Parameters. Real Parameters use the same Variable Types as Variables. A Parameter is like a Variable, except that it is constant and defined within the Model. A Parameter may be included in an Equation on a Model, but it will always be defined based on what it is set to in the Model Type, and the Parameter will never be solved for. Parameters can be connected so that the value of one Parameter can be automatically propagated to another Parameter.

A user can add Port Types 320 to Model Type 308 to determine how the Model Type can connect to other Model Types in a simulation. Port Types will be explained in greater detail later.

The display of variables and parameters will also be configured in the Model Editor. The definition of the "icon" for the model type will be shown in a panel called "Icon". New icons can be associated with a Model Type, Fluid Type or Port Type. The icon to be associated may be in the form of an Extensible Application Markup (XAML) file. Other icon formats may also be used.

In addition to configuring the icon, a user can also assign default positions for the appearance of the name of the model and for the appearance of desired variables and parameters. Later, when the model is placed into a simulation, a user can move the name or other field to another position, which will be saved within the simulation itself. The default locations of model name and other variables are saved in the model library, and when changed in the model library, the new positions propagate to each instance of the changed model type that is using the default position. Model instances that have a user-set position will not be changed to reflect the new default position.

If a variable is added to a model type icon that is an array, the user can add an index to display a single element. If an element number is not added, then when the variable is displayed on the canvas the entire array will displayed in a vertical column.

Some examples of standard Model Types are Source Models, Sink Models, Junction Models, Valve Models, and Pipe Models. The Source Model defines the flow and thermodynamic state of a feed stream. In Process Mode, the Source Model specifies the pressure, temperature, and flow of the stream. In Fluid Flow and Dynamics Modes, the flow is typically calculated.

The Sink Model sets downstream pressure at boundary in all modes. However, for refinery steam systems, a user may use the sink to set flow rates to typical refinery steam consumers.

The Junction Model is a mixing and splitting Model that represents a piping tee with up to two feed ports and two product ports. It has no internal volume and has no dynamic accumulation. It can be used to join flow-based models such as pipes, valves, and turbines, or to split a flow to pipes, valves, turbines, or PSVs.

The Valve Model is a flow-based Model. It can model incompressible (liquid) flow or compressible (vapor) flow including choked flow. In Process Mode, it will determine pressure drop and Cv given a known flow rate and known pressure difference. In Fluid Flow and Dynamics Mode, it will determine the flow given a known Cv and pressure difference.

The Pipe Model is a flow-based equipment Model. It uses a constant-density Darcy equation designed to model pipes with moderate pressure drop. As the pipe is made up of two internal Darcy equation Submodels with a density calculation in the middle, it can be used for up to 20% pressure drop. If the pressure drop is greater than 20%, multiple pipes in series should be used. By default, the pipe diameter can be estimated given a specified fluid velocity. An optional schedule of nominal pipe sizes can be enabled so that an actual pipe diameter can be fixed from the table. In Fluid Flow and Dynamics Modes, the pipe will determine the flow given a specified equivalent length, diameter and known pressure difference. In Dynamics Mode, the Model will determine transient pressure behavior based on the volume of the pipe and accumulation of fluid within it.

Model Types 308 may also have an inheritance feature that allows a user to create a new Model Type that extends an existing Model Type. This new Model Type would inherit all of the characteristics of the already existing Model Type, but the user could add new characteristics on to the new Model Type without altering the existing Model Type. In this way, users can include custom variables, parameters, and equations in their Model Types to better represent their particular system.

Figure 4:
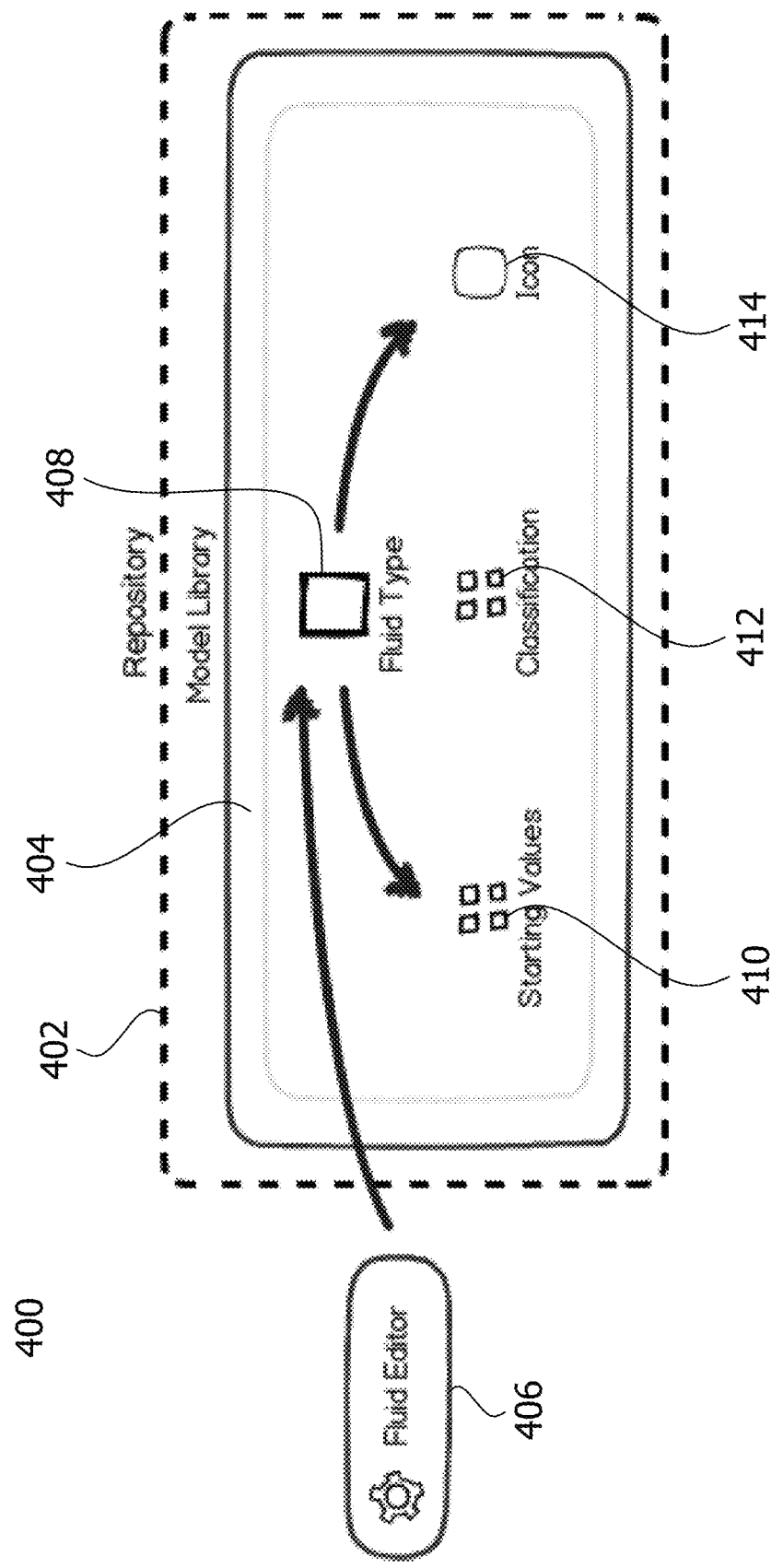
FIG. 4 is a diagram depicting the interaction between a fluid editor and a fluid type, and the model library of FIG. 2.

FIG. 4 shows a diagram 400 of the relationship between a Fluid Editor 406 and a Model Library 404 according to an embodiment of the invention. The Fluid Editor 406 modifies Fluid Types 408 representing the fluids used in the environment. The Fluid Type 408 describes the thermodynamic behavior assigned to Model Instances in a Simulation. Existing Fluid Types 408 are copied and edited to create custom Fluid Types 408 that include the default pressure and temperature (Starting Values 410) of the fluid to be emulated and a fluid classification 412 which defines equations to be used to calculate behavior of the fluid. The custom Fluid types 408 are saved to Model Libraries 406 stored in a SimCentral Repository 402. The Fluid Editor 406 also defines a custom icon 414 for the Fluid Type 406.

Because Fluid Types 408 created or edited with Fluid Editor 406 are saved in the Model Library 404 on the Repository 402, changes made to the Fluid Types 408 may be automatically saved to Repository 402 and propagated to all simulations that reference the changed Fluid Type 408 and are linked to the proper Repository 402 and Model Library 404.

The Fluid Editor 406 defines new Fluid Types 408 or edits existing Fluid Types 408 to fit specific requirements. Even standard Fluid Types 408 may be edited in this way, allowing for highly customizable Fluid Types 408.

Figure 5:
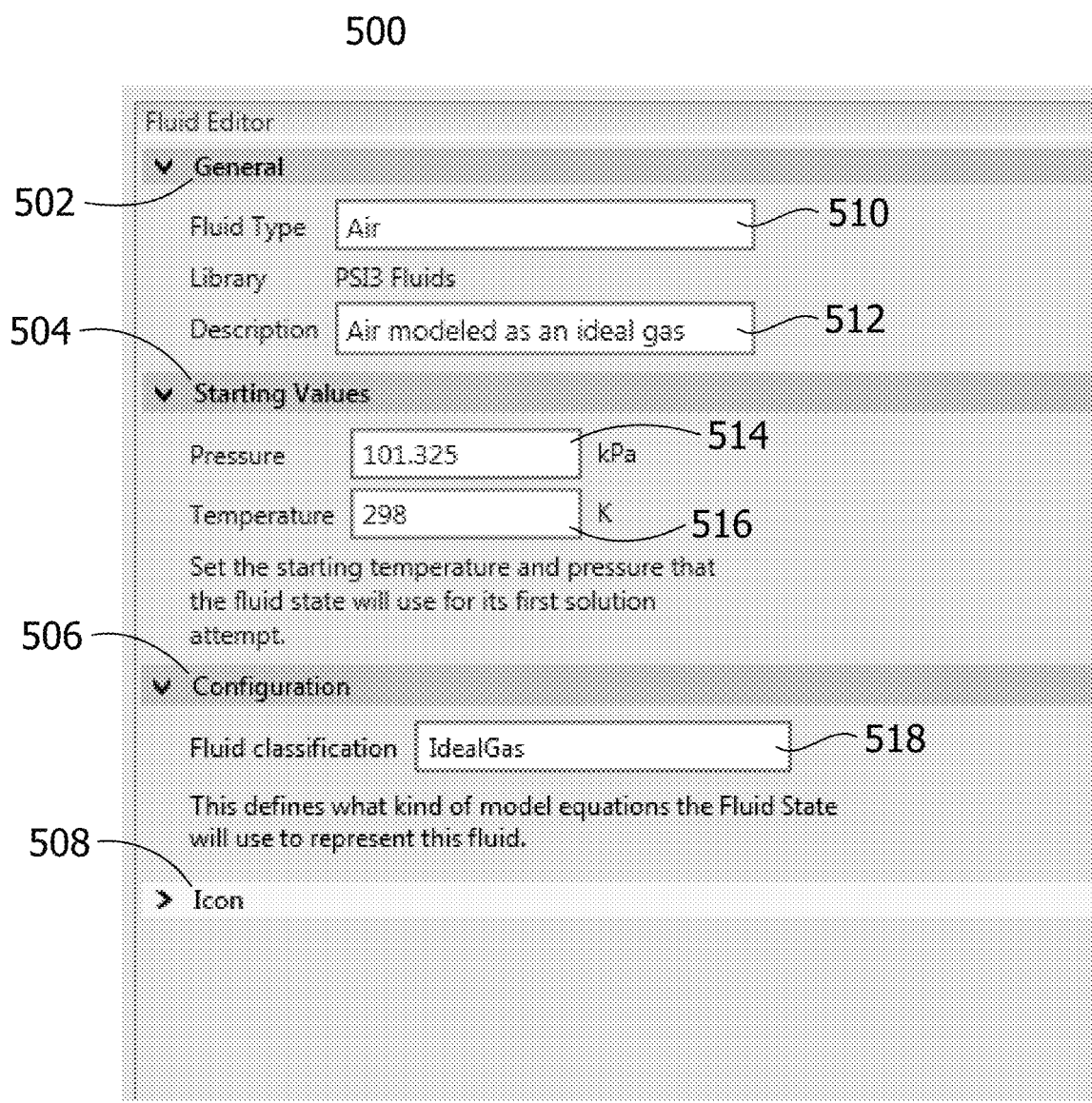
FIG. 5 is an exemplary screenshot illustrating a fluid editor screen according to an embodiment of the invention.

FIG. 5 shows an example of a dialog box 500 that may be used to create a new Fluid Type or modify an existing Fluid Type. A user can name a Fluid Type 510 and give it a description 512 in a General tab 502, give it starting values for pressure 514 and temperature 516 variables in the Starting Values tab 504, and choose a fluid classification 518 in a Configuration tab 506, which defines which equations are used to represent the behavior of the fluid. There is also an Icon tab 508 for configuring an icon as described above.

Figure 6:
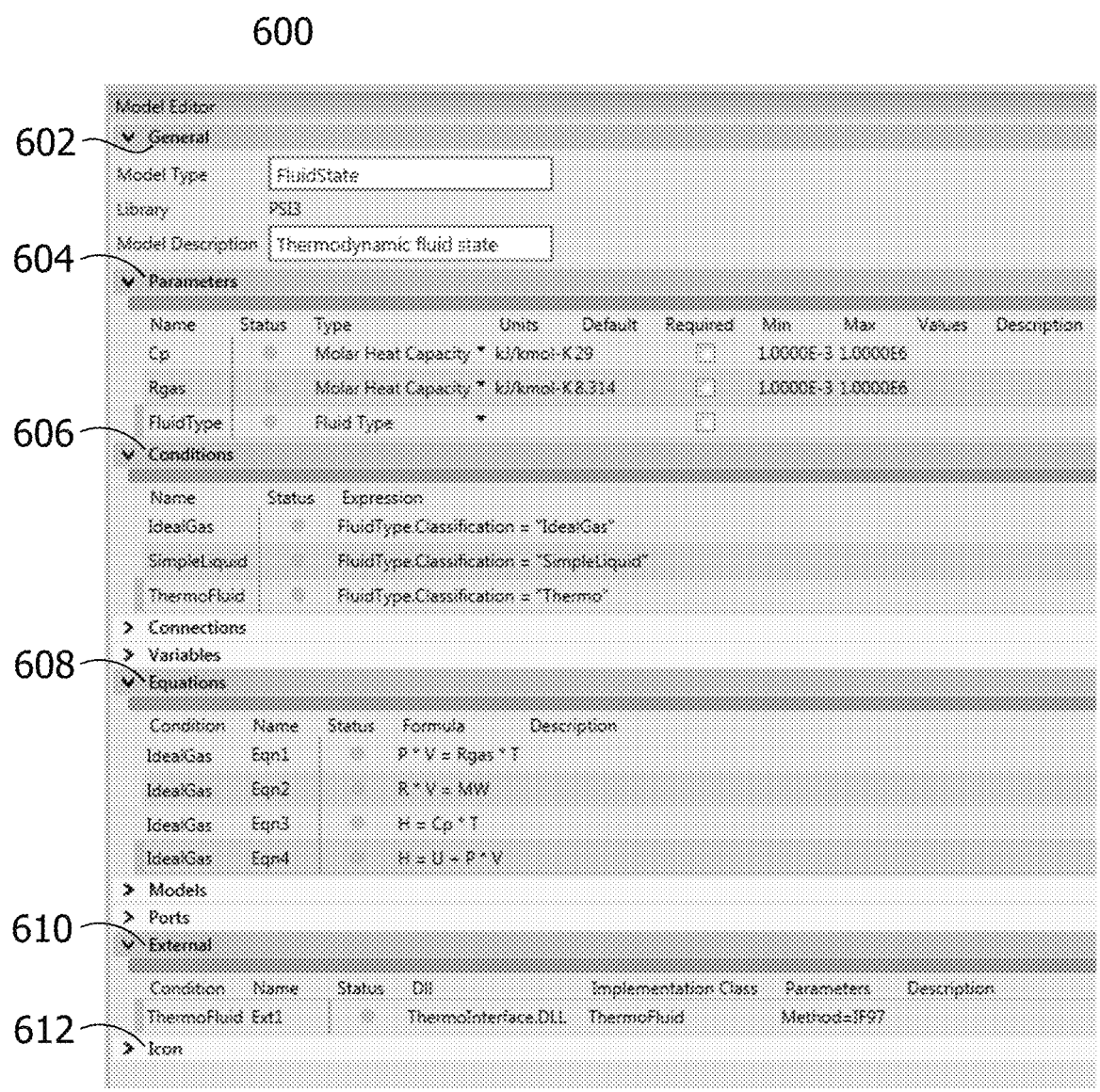
FIG. 6 is an exemplary screenshot illustrating a model editor screen according to an embodiment of the invention and used to configure a model type.

FIG. 6 shows a dialog box 600 that is representative of the Model Editor for editing a Model Type as described above. A user can observe or change the details of the Model Type, including the general information, like the name of the Model Type and the description of a Model Type 602. There is a section that shows the parameters of the Model Type 604, the conditions that affect a Model Type behavior 606, and internal equations that define the Model Type behavior 608. In addition, a user can use the "external" section to link to equations that might be external to a Model Type 610. Finally, there is an Icon tab for configuring the icon associated with a Model Type 612.

Figure 7:
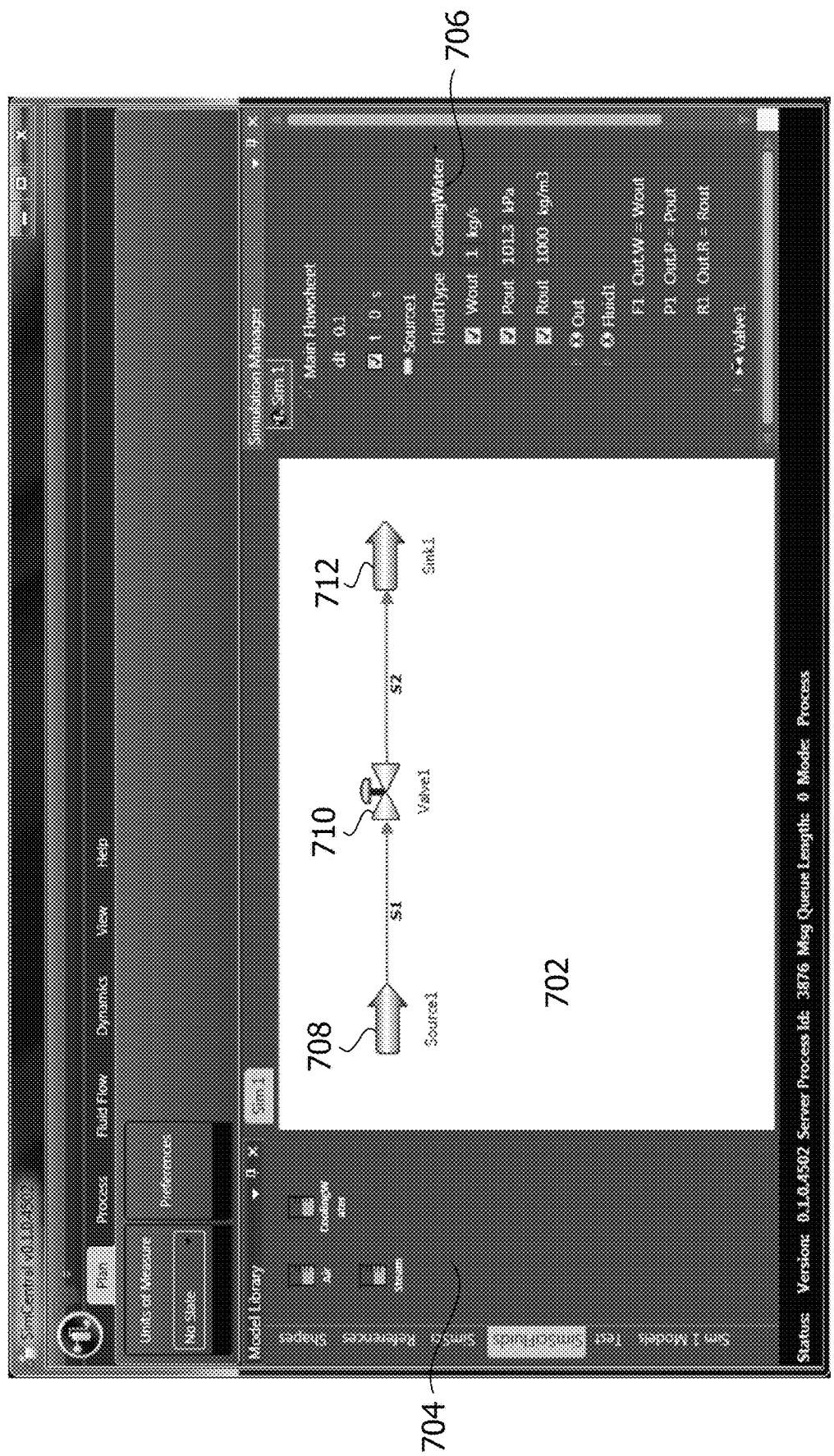
FIG. 7 is an exemplary screenshot illustrating a canvas where a simulation is being built with available model types in a model library according to an embodiment of the invention.

FIG. 7 shows an example of a flowsheet being built on a canvas 702 and a palette 704 to the left side that shows available fluids for use in the simulation (Air, CoolingWater, Steam). A user takes a fluid from the left side and associates it with the models in the canvas (Source1 708, Valve1 710, Sink1 712, etc.). The Source1 708 is a model that defines the characteristics of the Fluid as it enters the flowsheet and the Sink1 712 is a model that receives the fluid as it flows out of the flowsheet. The Valve1 710 is an exemplary model that interacts with a fluid. While this example is very simple, a flowsheet could contain many different interconnected models that interact with the Fluid in myriad ways. To the right, a hierarchical tree 706 displays information about the simulation being viewed/edited. In this case, it shows a model "Source1" which is using the "CoolingWater" fluid along with data about the model. The simulation would then simulate the behavior of the chosen fluid through the models on the canvas.

Figure 8:
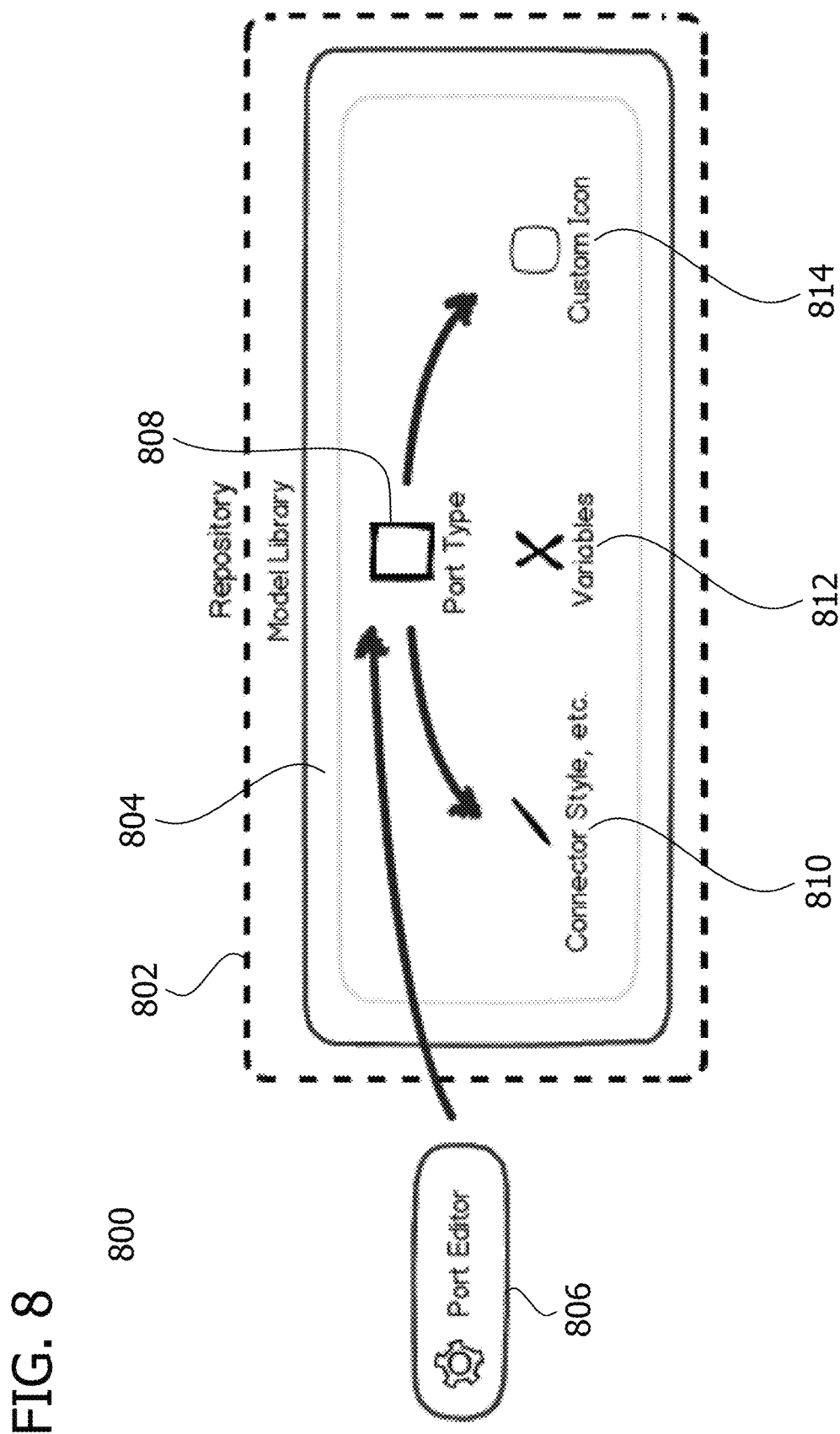
FIG. 8 is a diagram depicting the interaction between a port editor and a port type, and the model library of FIG. 2.

FIG. 8 illustrates a Port Editor feature of the simulation program embodying aspects of the invention. A diagram 800 displays the relationship between a Port Editor 806 and a Model Library 804. The Port Editor 806 creates and edits Port Types 808, which are used inside Model Types to define how the Model can be connected to other Models on the Canvas. Port Types also inherit much of the structure of Model Types as defined above. When new Model types are created, the Fluid Port Types 808 included with the simulation program in accordance with aspects of the invention can be used to define input and output Ports used for process stream connections. If no suitable Port Type exists, an existing Port Type 808 can copied and edited to be compatible. During editing, Port Type name is specified, Variables 812 and their types are specified, the Canvas connection (line) style 810 is determined, a description is included, and an Icon 814 is determined. The Variables 812 defined in the Port Type 808 define the specific information that will be transferred between Models when they are connected on the Canvas. Once a Port Type 808 is defined, the Model Editor can use those Port Types to add Ports to Model types. Connections between Models on the Canvas can only be made between Ports of the same type. Ports 808 are saved in the Model Libraries 804, which are stored in a SimCentral Repository 802.

Because Port Types 808 created or edited with Port Editor 806 are saved in Model Library 804 on the Repository 802, changes made to the Port Types 808 may be automatically saved to Repository 802 and propagated to all simulations that reference the changed Port Type 808 and are linked to the proper Repository 802 and Model Library 804.

The Port Type 808 created or edited in Port Editor 806 can be made up of a variety of data, including conditions, variables 812, parameters, and connector line characteristics 810. Icons 814 can be associated with Model Types as well.

Conditions cause the creation, non-creation, or removal of affected Variables, Equations, Models, and Ports. Furthermore, Conditions may be based on integer or enumerated Parameters and must evaluate to a Boolean. Before a user can add a Condition, an integer or enumerated Parameter must be created. Conditions are evaluated when a Model Type containing a Port Type is first placed on a Flowsheet, when a Parameter value is changed, and when a Port Type is modified in the Port Editor. By using Conditions in conjunction with Parameters, a user can create optional or configurable Model Type behavior.

A user can add Variable 812 to a Port Type in the Port Editor, associate a Condition with it, and specify it for particular Simulation Modes. Simulation Modes will be discussed in greater length below. Choosing to specify a Variable for a particular Simulation Mode means that, when the system is solving an equation, that specified Variable is defined before solving the equation, rather than being solved for with the equation. This allows a user to determine how different Simulation Modes affect a Port Type and which variables need to be solved for in each Simulation Mode. Variables have a variable type that determines what the variable measures and what units of measure the variable uses.

If a variable is added to a port type icon that is an array, the user can add an index to display a single element. If an element number is not added, then when the variable is displayed on the canvas the entire array will displayed in a vertical column.

In an embodiment, Simulation Manager is a hierarchical view of the Simulation and the Models contained within it. The Simulation Manager provides a hierarchical view of a Simulation, including models, connectors, and their sub-models and ports. In addition, the Simulation Manager allows the addition of variables, parameters, and equations directly to the main flowsheet. The Keyword View enables viewing and editing objects selected in the Simulation Manager. When selecting a Simulation object in the Simulation Manager, the Keyword View displays a detailed view of the selected object and enables editing of specific Variables and Parameter values.

Further, Simulation Canvas enables a user to build a visual representation of the Simulation. A user drags Model Types from the Model Library onto the canvas, connects the Models using Connectors and Ports and adds a Trend and Variable references to the Canvas. A user specifies Variables and enters values, views the state of Equations, modifies Variable and Parameter values, and adds Trends. Changes made in the Simulation manager are automatically reflected in the other application views and on the Simulation Canvas.

Figure 9:
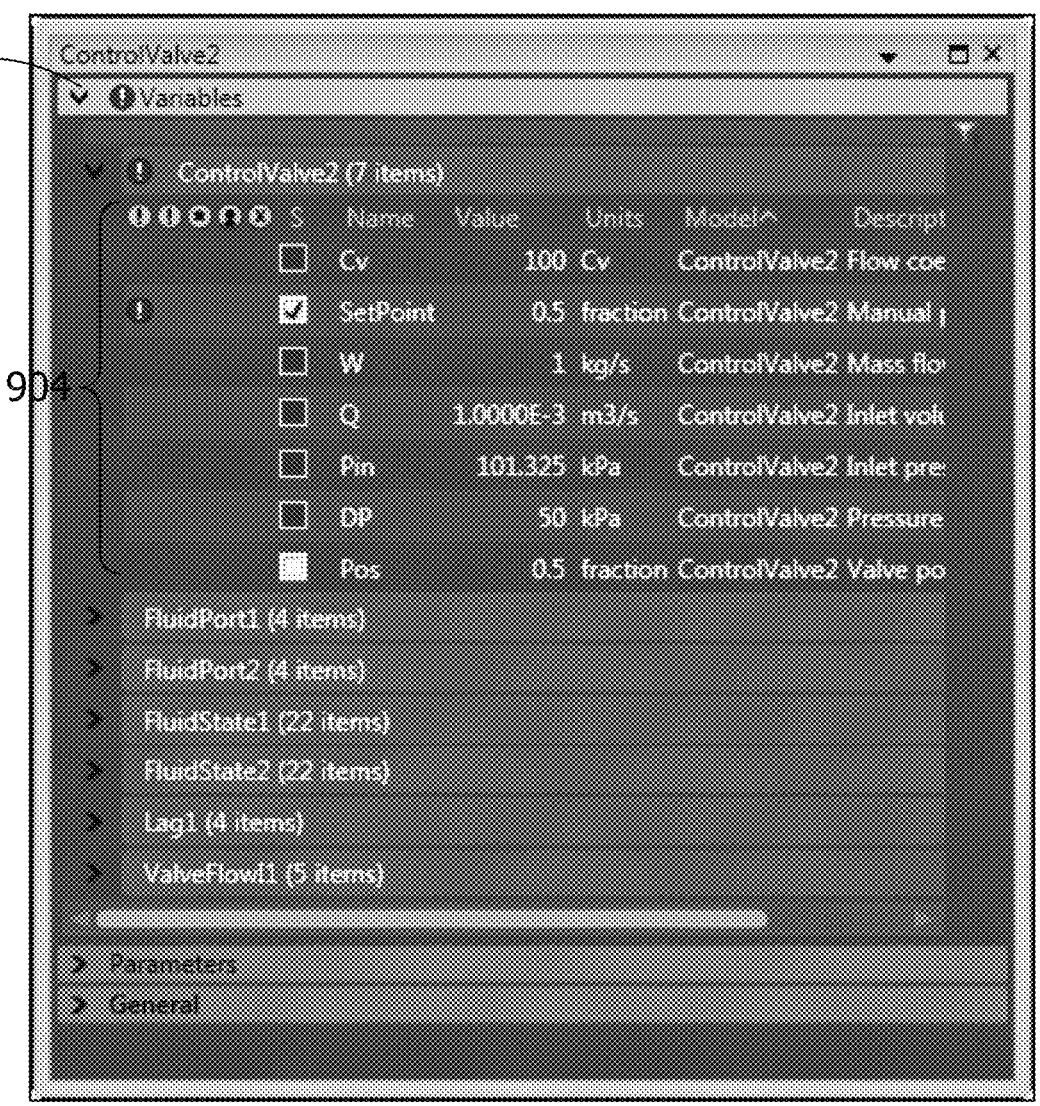
FIG. 9 is an exemplary screenshot illustrating a property inspector screen used to observe details about models in a simulation according to an embodiment of the invention.

FIG. 9 shows an exemplary screenshot of a Property Inspector 900. The Property Inspector 900 displays and edits Models from the Canvas. The Property Inspector 900 also sorts and groups Variables and filters Variables and Parameters. In the screenshot, tabs can be seen for different groups, including Variables 902, Parameters, and General. Each of these tabs can be expanded and collapsed to allow for viewing and editing of the grouped information therein. The Variables tab 902 is open and displays the variables 904 associated with a particular Model called ControlValve2. The group of variables 904 shows a variety of information about each variable, including Name, Value, Units, Model, Description, and Status Badges.

The Property Inspector 900 is accessed by double-clicking a Model on the Simulation Canvas, or by right-clicking a Flowsheet or Model on the Simulation Manager and selecting Properties from the context menu. Changes made in the Property Inspector 900 propagate automatically to the other parts of the User Interface, including the Simulation Manager and the Simulation Canvas. The Property Inspector 900 allows for Variables to be sorted or grouped for easier navigation of complex systems.

Figure 10:
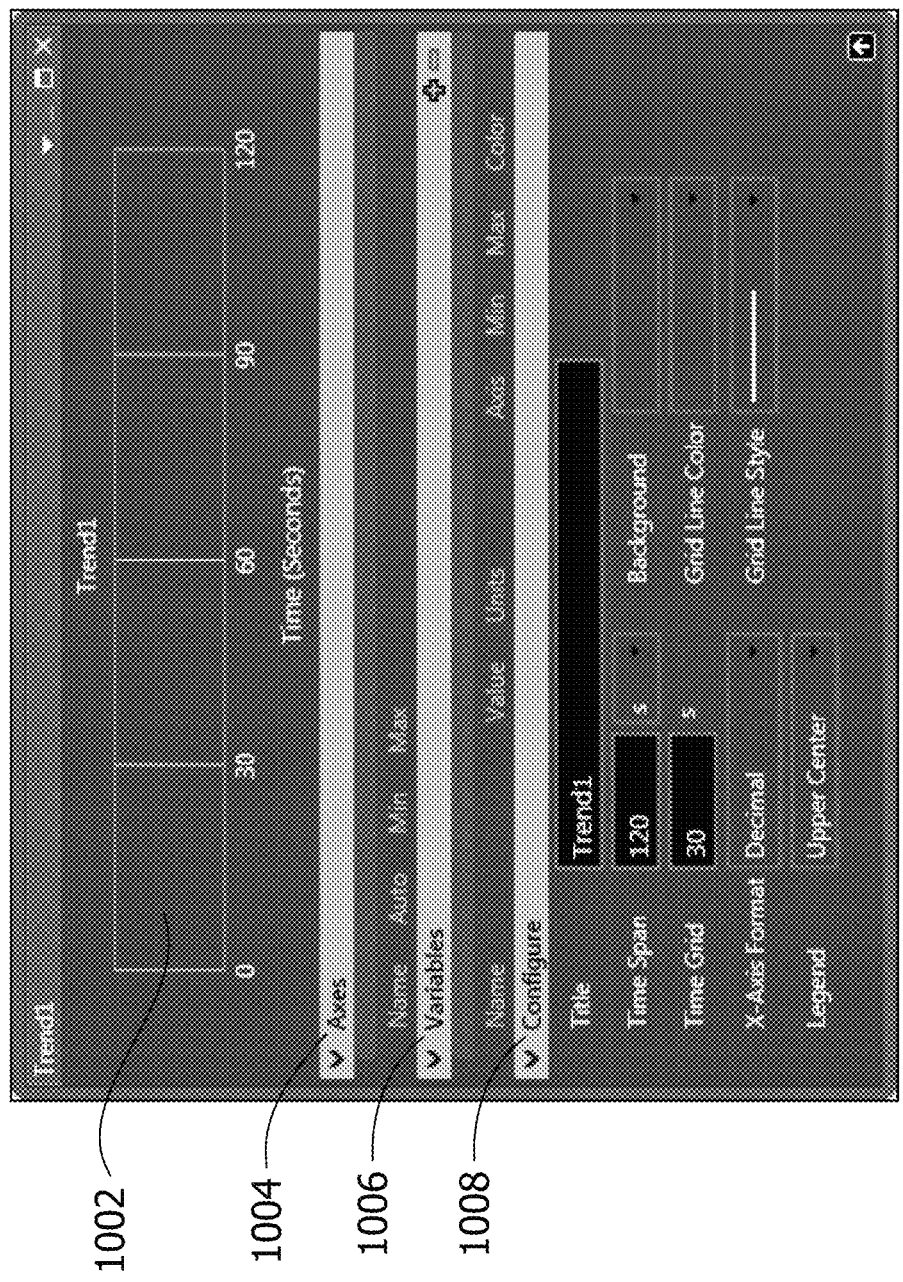
FIG. 10 is an exemplary screenshot illustrating a trend manager screen used to observe and configure the tracking of variable trends during simulation according to an embodiment of the invention.

Trends can be added to Simulations. Trends plot the time history of a Variable in Dynamics mode. The Trend Manager manages Trends in the simulation program. FIG. 10 shows an exemplary screenshot of a Trend Manager window 1000. The window 1000 contains several different sections for observing and configuring trends. A first section 1002 shows a visual representation of a trend line. As an example, section 1002 shows a timeline with time measured in seconds on the horizontal axis. In an Axes section 1004, names and limits may be configured for the axes of the trend graph shown. In a Variables section 1006, the variables being monitored on the trend graph can be configured, including setting their minimum and maximum values as well as line colors. The configure section 1008 allows configuration of the trend graph grid itself. Trend look and feel can be modified and changes are automatically saved and displayed on the Trend chart.

A user can check that a Simulation and its components are solved via the Solution Status section on the Ribbon, the Simulation Manager, and the Property Inspector. A user can check a Solution Status section of the Process tab to check if the Simulation currently displayed on the Canvas is solved. As the Simulation is analyzed and solved as a whole, the Solution Status indicates whether the simulation contains user-entered values for all the required data, whether the simulation is property specified ("square"), and whether the solution is solved. More details about how a solution is solved are described below.

Specific Parameters and Variables can be filtered in the Property Inspector or Keyword View to include or exclude information in a Simulation. When a filter is set, the filter is saved and automatically loaded when the simulation program is launched.

To convey information in an intuitive, non-intrusive way, the simulation program embodying aspects of the invention dynamically badges parts of the user interface. As a rule of thumb, green badges signify a good, solvable state or default data, blue badges signify that something has been set or touched by a user, yellow badges indicate a warning state and red badges mean that there is an error.

Figure 11:
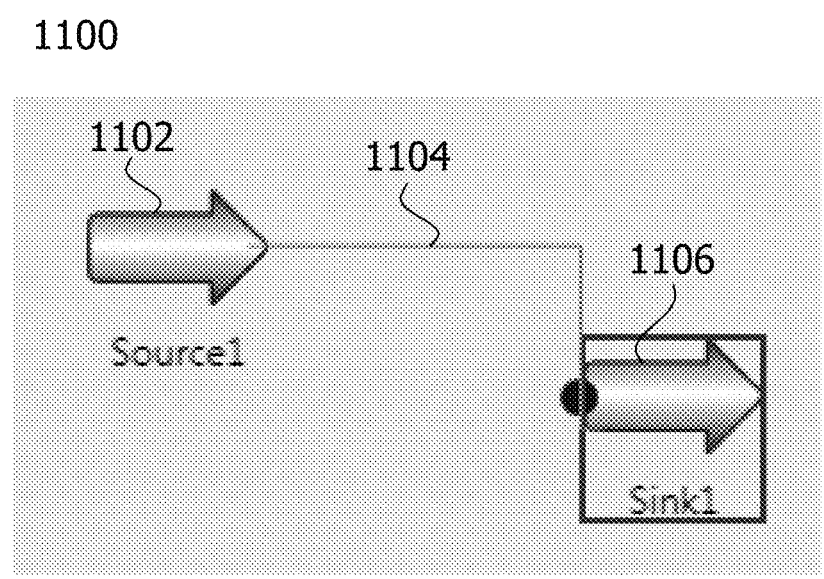
FIG. 11 is a diagram depicting the use of a connector in connecting a source model to a sink model according to an embodiment of the invention.

FIG. 11 displays an exemplary screenshot of a basic Connector 1104 between Models 1102 and 1106 on a Simulation Canvas 1100. As a user moves the mouse over the target Model 1102, the available Ports appear, highlighted. Moving the mouse to the target Port on Model 1106 and releasing the mouse button completes the Connector 1104. The connected Models can be repositioned after the connection is formed and the Connector 1104 will shift position along with the Models. Drag an end of a Connector away from a model and release it to temporarily disconnect a Connector.

In an embodiment, the simulation program supports user and Simulation preferences. User preferences can be changed, such as the Simulation Canvas background or display theme, and the selected preferences are saved and maintained across different Simulations throughout the simulation program.

Simulation preferences, such as choosing to display Model and connector labels, are saved on a per-Simulation basis; for example, if a user chooses to hide Model labels on Simulation A, but wants to display them on Simulation B, each preference will be saved in the Simulation to which it applies.

Figure 12:
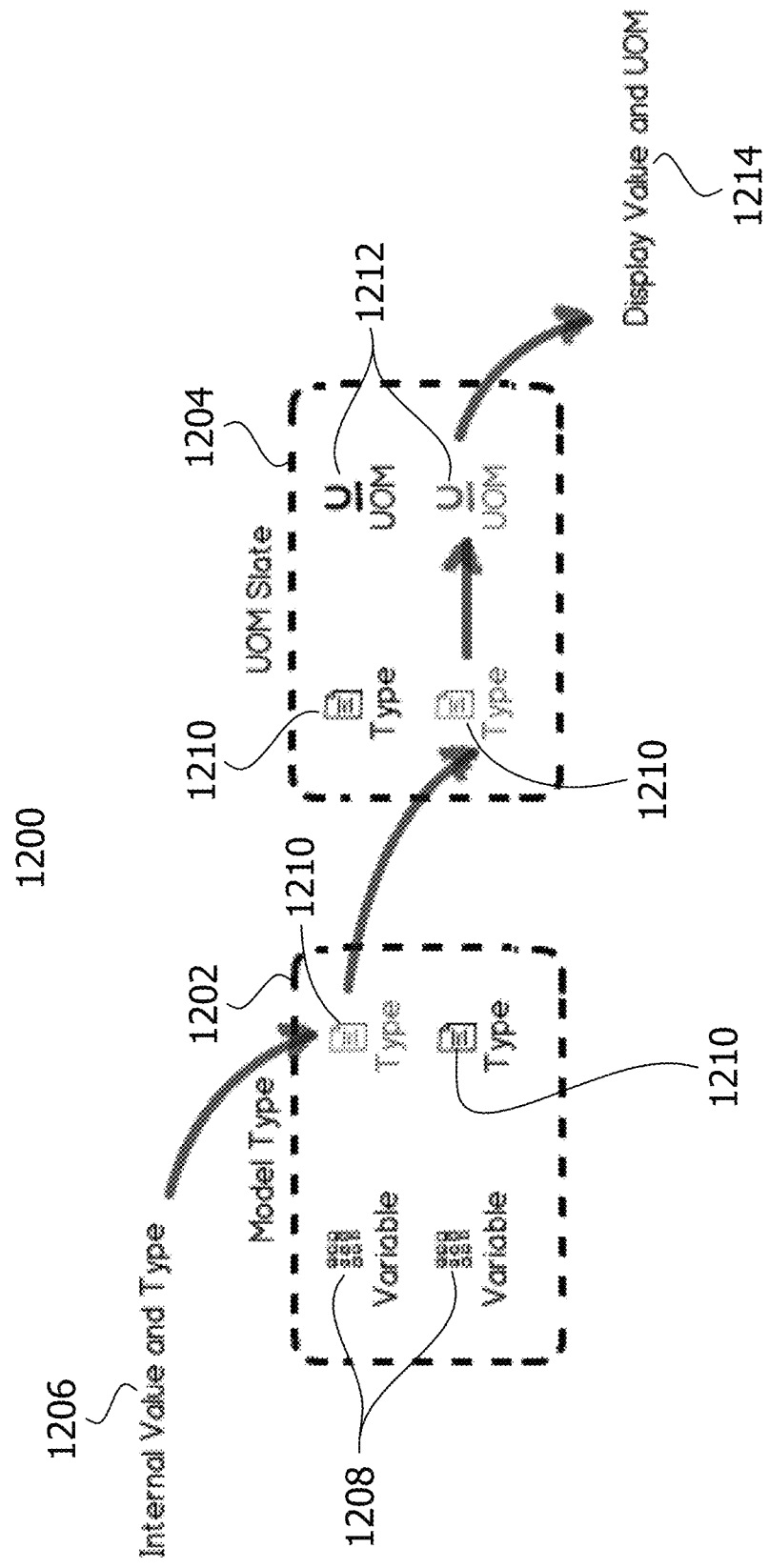
FIG. 12 is a diagram depicting the relationship between Units of Measure (UOM) Slates and Model Types according to an embodiment of the invention.

The diagram of FIG. 12 displays the relationship between Model Types 1202 and Unit of Measure (UOM) Slates 1204. Units of Measure (UOM) Slates 1204 are a collection of UOMs that are used for numerical display within the user interface. Each UOM Slate defines a default UOM 1212 to be used for each Variable Type 1210. UOM Slates 1204 can be created, modified, copied and deleted. Furthermore, preferred UOM Slates 1204 are selected for use in a Simulation, and the change will be reflected in the numeric values displayed in the simulation program according to an embodiment of the invention.

Every Variable 1208 and Real Parameter in the simulation program is associated with a Variable Type 1210, such as Pressure, Temperature and Mass Flow. Every Variable Type 1210 has a permanent internal UOM 1212. Changes are made to a UOM 1212 in the Property Inspector or Simulation Manager. Changes made to the UOM 1212 for a specific Variable 1208 are reflected in every instance of that Variable 1208, except for Variable references and Trends. Variable 1208 references and Ports will follow the UOM 1212 of the Variable 1208 until it is manually changed by the user using the Simulation Manager, Property Inspector, or Keyword View. After a manual change, independent UOM selection is enabled and the selected UOM will take precedence.

Figure 13:
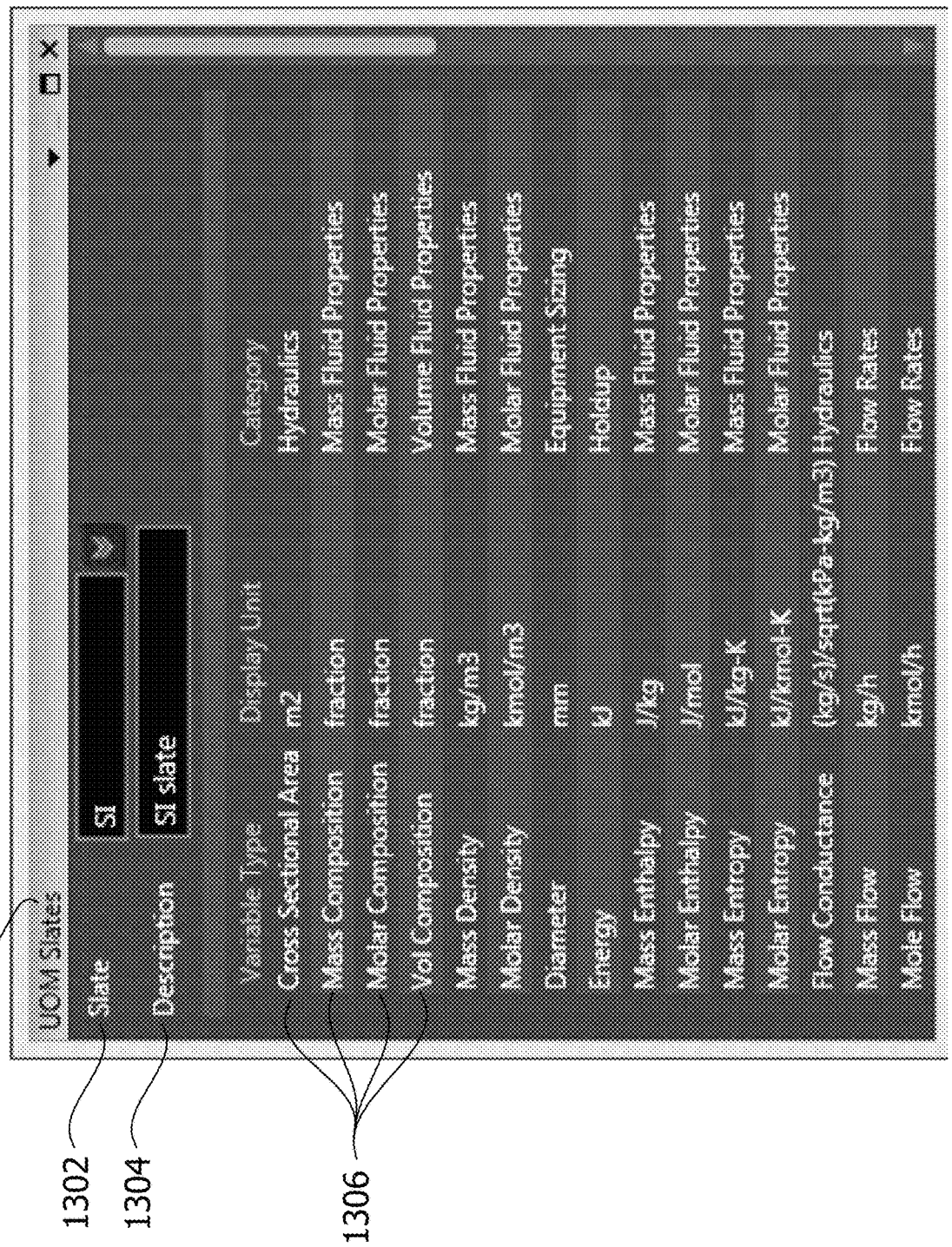
FIG. 13 is an exemplary screenshot illustrating the UOM slate of FIG. 1 storing default units for use with a list of variables.

FIG. 13 displays an exemplary screenshot of a UOM Manager 1300 for configuring a UOM Slate. In an embodiment, the simulation program provides users with two UOM Slates, SI and US Refining, but a user can create their own custom UOM Slates. FIG. 13 shows the SI UOM Slate, as can be seen in the Slate name area 1302. The UOM Manager also shows the Slate Description 1304 and each of the Variable Types 1306. Each Variable Type 1306 has a Display Unit and a Category. Variable Types 1306 are organized by category for easier navigation during UOM Slate definition.

Using the UOM Manager, a user can add, modify, copy, and delete UOM Slates from the system. UOM Slates are stored in the Repository alongside the Model Libraries and Simulations. Changes made to UOM Slates may be automatically saved to the Repository and propagated to all simulations that reference the changed UOM Slate and are linked to the proper Repository. UOM Slates can be saved on the Repository and may also be saved with specific simulations.

Figure 14:
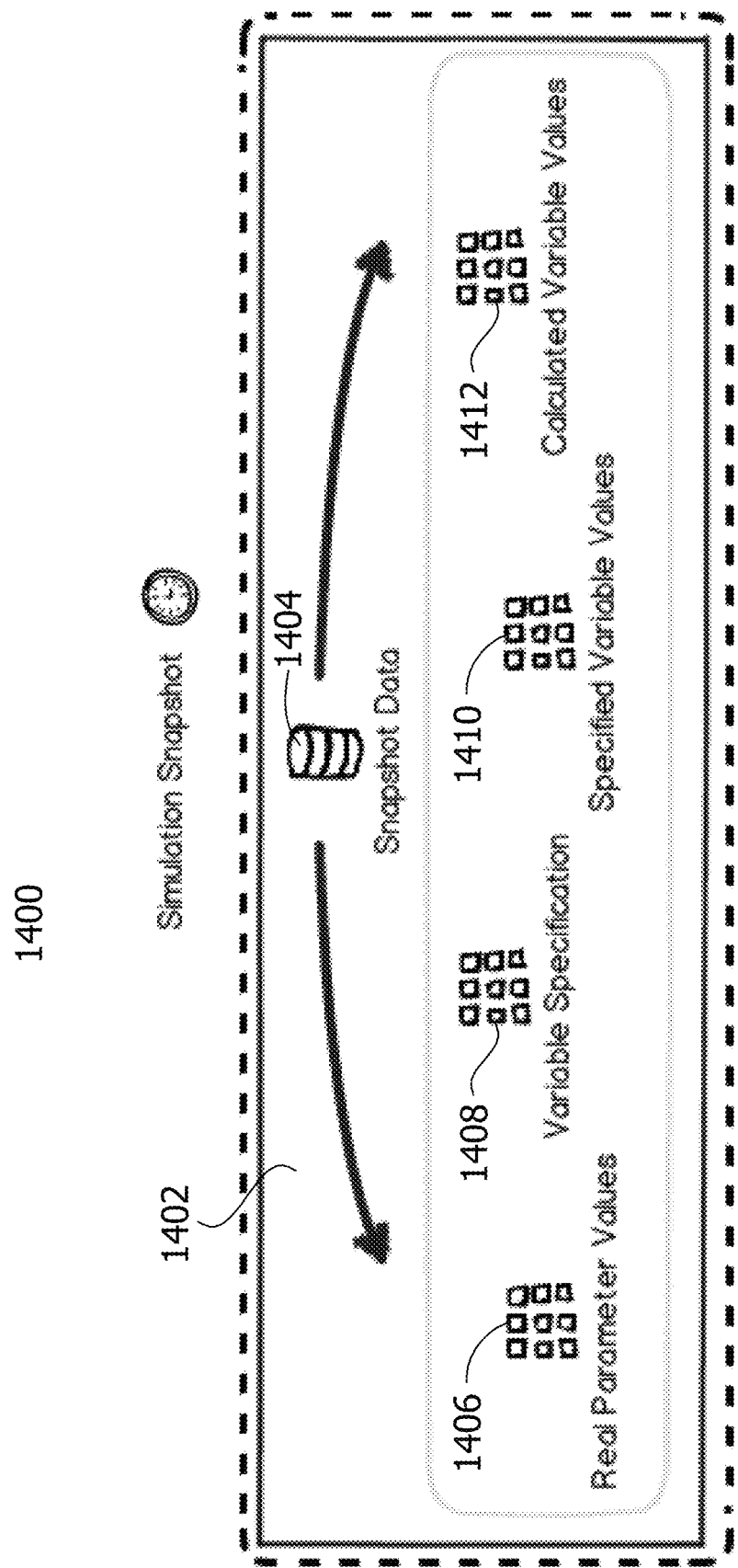
FIG. 14 is a diagram depicting the contents of a simulation snapshot according to an embodiment of the invention.

FIG. 14 displays a diagram 1400 describing a Simulation Snapshot 1402. A Snapshot 1402 is an archive of the state of the Simulation at a previous solution. It contains all Variable values 1410 and Real Parameter values 1406 and the Variables' specification status 1408 as well as Calculated Variable Values 1412. The simulation program according to an embodiment of the invention creates Snapshots that allows a Simulation to return to a previous solution. For example, a Snapshot can be saved before modifying a Simulation by changing values or changing specifications. The saved Snapshot can be used to revert to the previous version of the Simulation in the event that the user wants to return to the previous set of specifications/values. Snapshot Data 1404 is stored within the Repository and associated with the specific Simulation from which it was created. In this way, Snapshots can be saved of particular states of a Simulation and then accessed by multiple users of that simulation.

Figure 15:
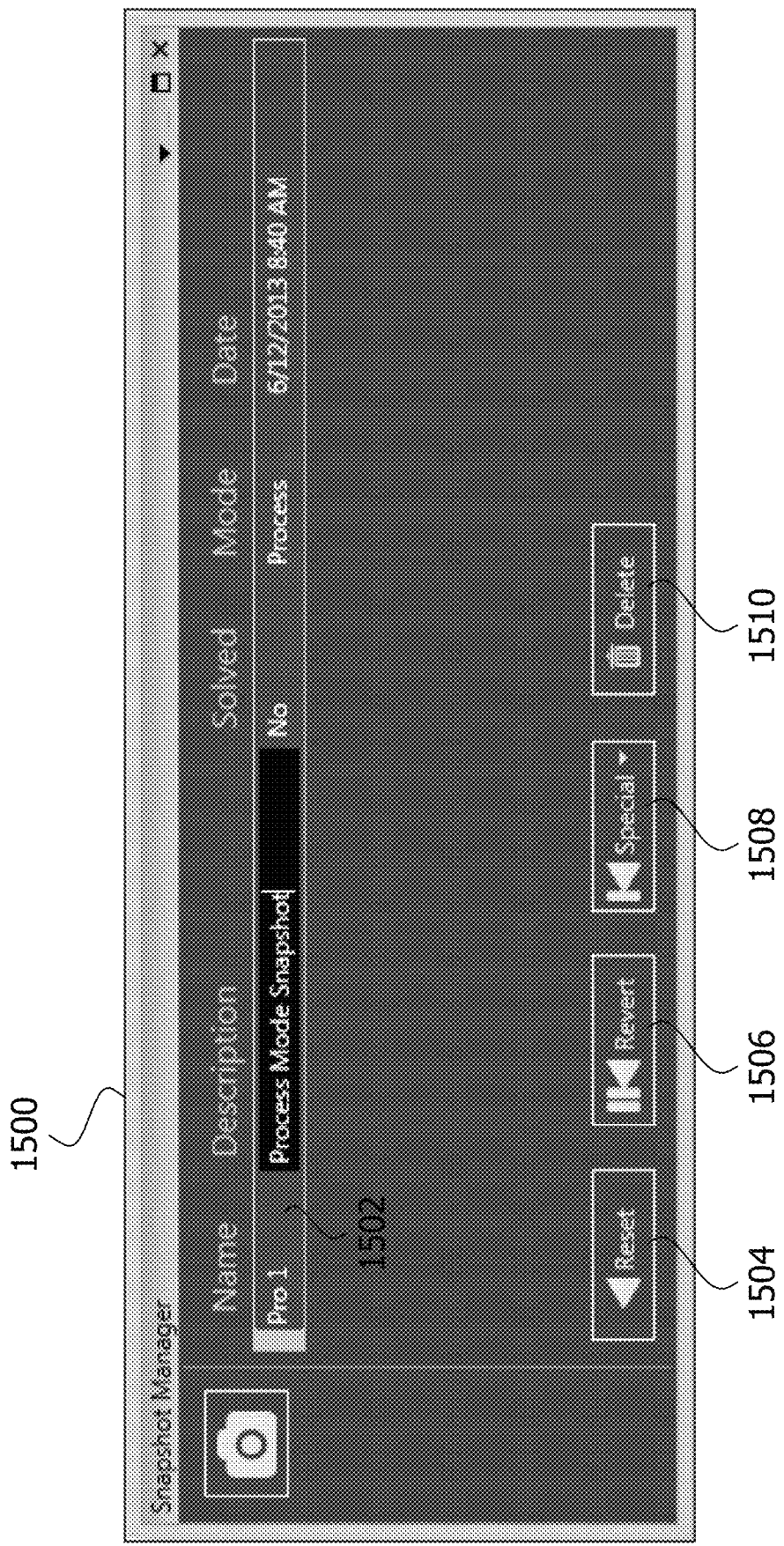
FIG. 15 is an exemplary screenshot illustrating a snapshot manager for managing snapshots and reverting to previously stored snapshots according to an embodiment of the invention.

FIG. 15 displays Snapshot Manager 1500. The Snapshot Manager 1500 creates a new Snapshot or returns to a previous Snapshot. And Snapshot Manager 1500 contains a single Snapshot 1502 named "Pro1" and described as "Process Mode Snapshot". The Snapshot Manager 1500 enables a user to change the name and description among other details about a given Snapshot. Using Snapshot Manager 1500, a Snapshot can be reset 1504, reverted 1506, or deleted 1510. The Special button 1508 enables more advanced Snapshot actions. A created Snapshot is saved with the related Simulation. Multiple Snapshots are created of the same simulation and a specific Snapshot can be restored as desired. A user determines what type of data to load upon Snapshot restoration. The Snapshot Manager 1500 chooses Simulation Snapshot-specific settings to load for returning to a previous state. The Snapshot Manager 1500 is accessible from each of the Mode tabs.

Figure 16:
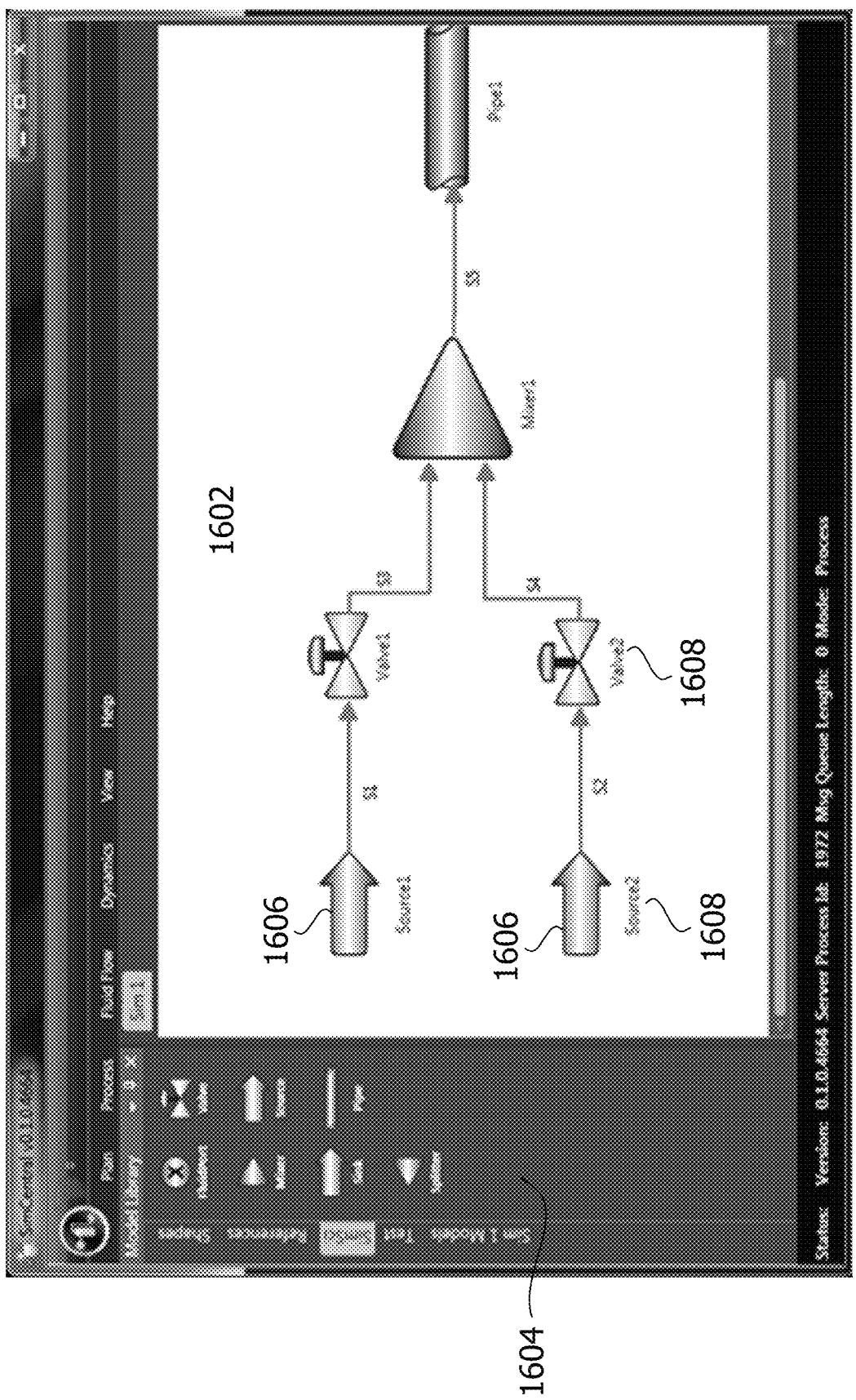
FIG. 16 is an exemplary screenshot illustrating a simulation being built at a first zoom level according to an embodiment of the invention.
Figure 17:
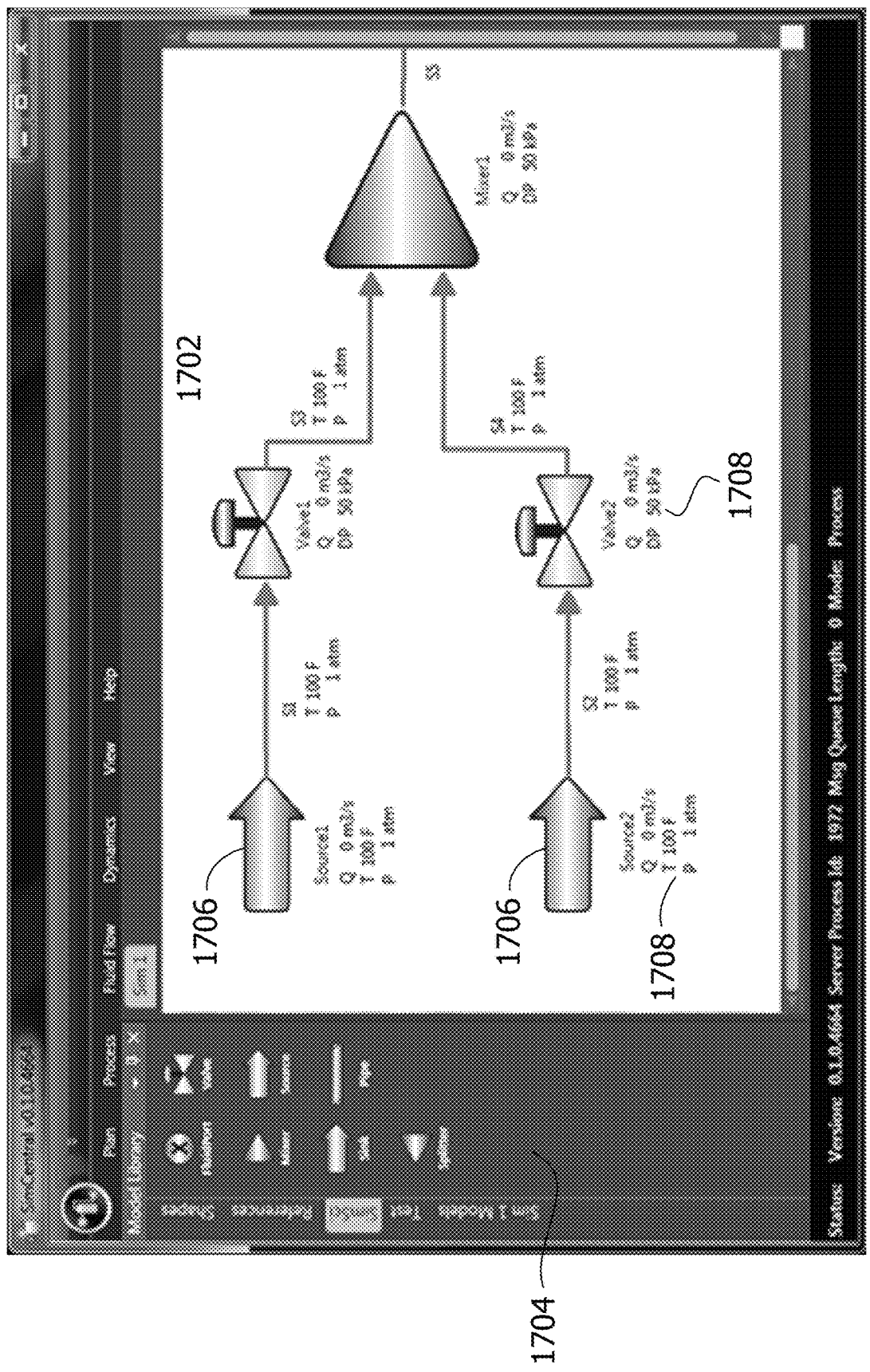
FIG. 17 is an exemplary screenshot illustrating the simulation of FIG. 16 at a greater zoom level.
Figure 18:
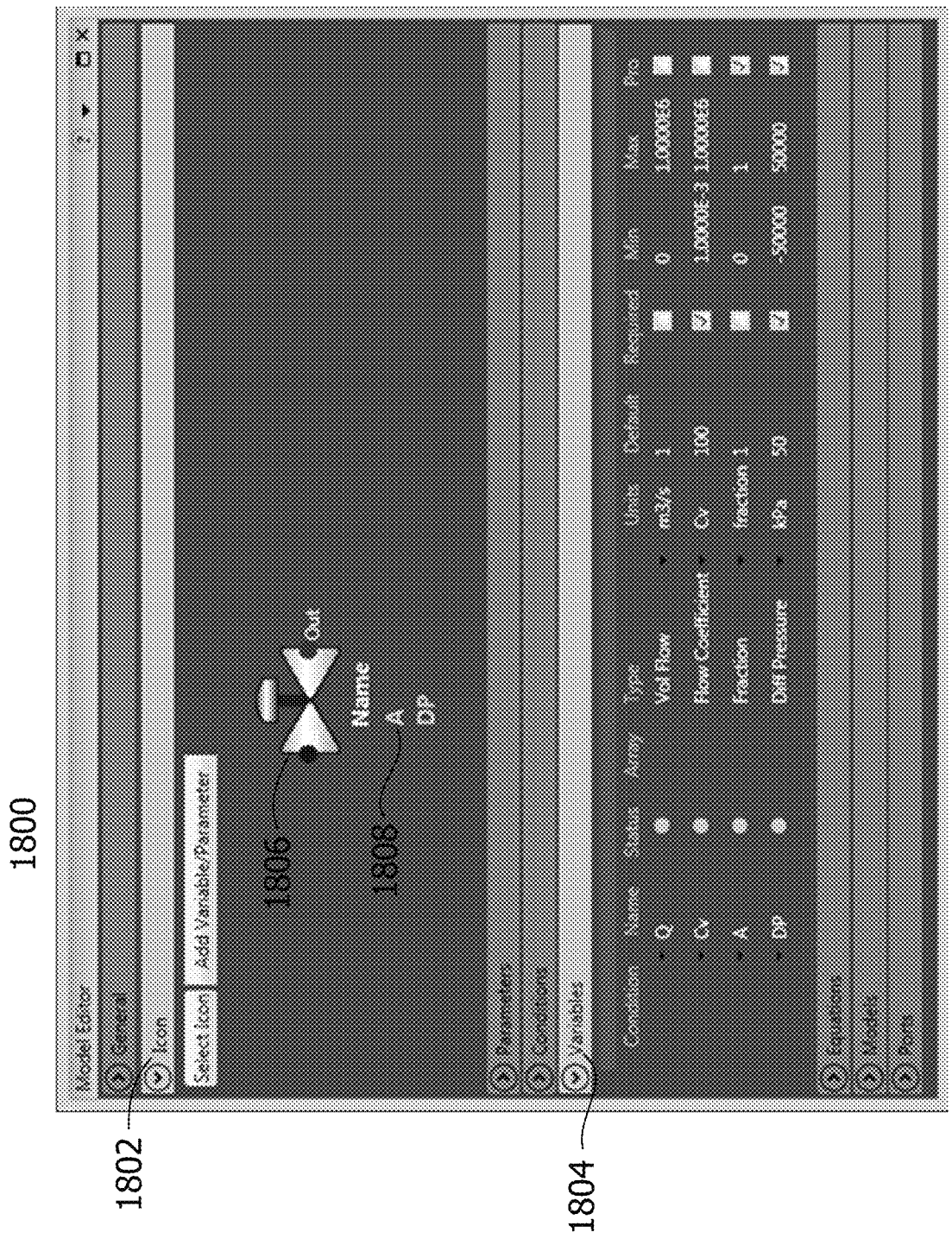
FIG. 18 is an exemplary screenshot illustrating the use of the model editor of FIG. 2 to configure what data is displayed for a model, where it is displayed, and at which zoom levels is it displayed.

Referring now to FIG. 16, FIG. 17, and FIG. 18, when zooming in on the canvas, model instances can display additional information as the zoom level increases. The specific information to be displayed is configured by the model editor when building the model types. This is known as "semantic zoom".

FIG. 16 displays an exemplary screenshot 1600 of a canvas 1602 containing a plurality of models 1606 connected together to form a simple Simulation. The canvas 1602 is viewed at a particular zoom level and at this zoom level, each model has an associated name 1608 displayed. More models may be added to the canvas 1602 from the model palette 1604.

FIG. 17 shows a screenshot 1700 of the canvas 1602 from FIG. 16 with an increased zoom level. As a result of zooming in, each of the models 1706 on the canvas 1702 appears larger than in FIG. 16. Each of the models 1706 still includes the associated name information and also includes additional information 1708 about the model. For instance, under each model, the temperature and pressure values associated with the model are displayed. When a user zooms in on a canvas and crosses a semantic zoom threshold, additional data as shown here may be displayed in order to give the user additional information. When zooming out and crossing a semantic zoom threshold, the additional data is no longer displayed and the model data will revert back to showing less data. By showing less data at a "zoomed out" level, a complex simulation may be easier to understand as the view of the models is simplified.

FIG. 18 shows a screenshot 1800 of the Model Editor. The Model Editor is used to determine what information is displayed near a model on the canvas. In the Icon section 1802, the icon 1806 representing the model on the canvas is shown. Additional data 1808 is shown near the icon and will be populated with the actual data values on the canvas, as seen in FIG. 17. In this case, the icon 1806 shows a valve with an input and output and three data fields 1808, including Name, a Fraction (A), and Difference Pressure (DP). The equivalent variables are shown below in the Variable section 1804. The location where the data 1808 appears around the icon can be changed in the Icon section 1802. In this case, the data 1808 appears under the valve icon 1806, but it could be moved to appear above or to the side of the icon as well. The Variable section 1804 enables a user to configure individual variables to appear at different levels of zoom as shown in FIG. 16 and FIG. 17. In this case, the Name appears at all zoom levels and the Fraction and Differential Pressure may only appear when zoomed in closely to the icon on the canvas.

The specific zoom percentage can be changed by the user and are saved as a "user preference". It will also be possible to set the "zoom percentage" for a specific canvas (just like current canvas background color). This will allow each simulation being able to specify different values.

When the semantic zoom values are displayed, a Simulation Builder can view/modify values and change the units-of-measure, the same as with "variable references". At 100% zoom, the default zoom level, models and connectors are shown in their default state. Show/Hide of labels is set by "Model Labels" and "Connector Labels" check boxes on the View tab of the Ribbon. As the user zooms in, the icons grow big but the text remains the same size. When the zoom level reaches the defined 200% level (or the user-entered alternate percentage as defined) the model instances are decorated with information as defined by the Model Developer.

Using the "semantic display" features, the display is fully interactive; the user can modify the variable/parameter values and change the units-of-measure, just like they can with the "variable reference". The exact position of the individual variables/parameters can be changed by the user. If it is moved, the new position will be saved with the simulation.

Standard propagation rules will apply: if a user changes the definition (variables/parameters shown) of the semantic zoom view, all model instances will be updated. If a user changes the position of a variable/parameter, then all model instances will be updated except for those specific variables/parameters that have been changed and are no longer in default positions.

The simulation program embodying aspects of the invention includes three Simulation Modes Process Mode, Fluid Flow Mode, and Dynamics Mode. Process Mode performs steady state Simulations to create and improve process design, Fluid Flow Mode is a steady state simulator that models piping networks and Dynamics Mode simulates system transients over time. A Simulation created in Process Mode, for example, can be switched to Fluid Flow Mode by changing the Mode toggle.

Simulation Mode is toggled between Process, Fluid Flow and Dynamics Mode by selecting the desired mode in the application ribbon on the Process, Fluid Flow and Dynamics tabs, respectively. Process mode is selected upon creation of a new Simulation. The Variable specification in the Simulation will automatically change upon switching Modes based on the default settings for each mode for each Model Type, as defined by the Model Library. The different Simulation Modes also include options relevant to the mode selected; for example, the ability to automatically solve the simulation in Process Mode and go to a steady state in Dynamic Mode.

Process Mode performs steady state Simulations to create and improve process design. It is designed to perform mass and energy balance calculations. Process Mode is selected on-the-fly under the Mode section. In Process Mode, the Variable specification of equipment in the Simulation will change according to the definition for each Model type.

Fluid Flow Mode is a steady state simulator that models piping networks. Fluid Flow Mode can be selected on-the-fly under the Mode section. In Fluid Flow Mode, the Variable specification of equipment in the Simulation will change according to the definition for each Model type. Dynamics Mode simulates system transients over time. Dynamics Mode can be selected on-the-fly under the Mode section. In Dynamics Mode, the Variable specification of equipment in the Simulation will change according to the definition for each Model Type.

The modes primarily affect the basic specification of the simulation: which variables are fixed or freed and which parameters, variables, and equations are active or inactive. In the final environment it may also affect the preferred icons available in the icon palette and the specific layers viewable by default.

The different modes have previously been handled by separate programs, such as PRO/II, ROMeo, and Dynsim. In the simulation program, it is desired to have one application that can use one simulation model in all interested modes. The general strategy for multiple mode support in the simulation program is as follows:
  i. The model developer defines the mathematical relationships (equations) between the relevant process simulation variables.
  ii. The user builds a simulation with these models. The user will select a specific "mode" to be used, which implies that some of the simulation variables will have fixed quantities, with the remaining to be calculated.
  iii. When the simulation is solved, the system will apply standard mathematical solver techniques to solve the set of equations and variables for the unknown variables.
  iv. When the user changes to a different "mode", this will change the set of simulation of variables that will have fixed quantities. With these new settings, a different set of unknown variables will be solved for. The mathematical equations will be unchanged.

Figure 19:
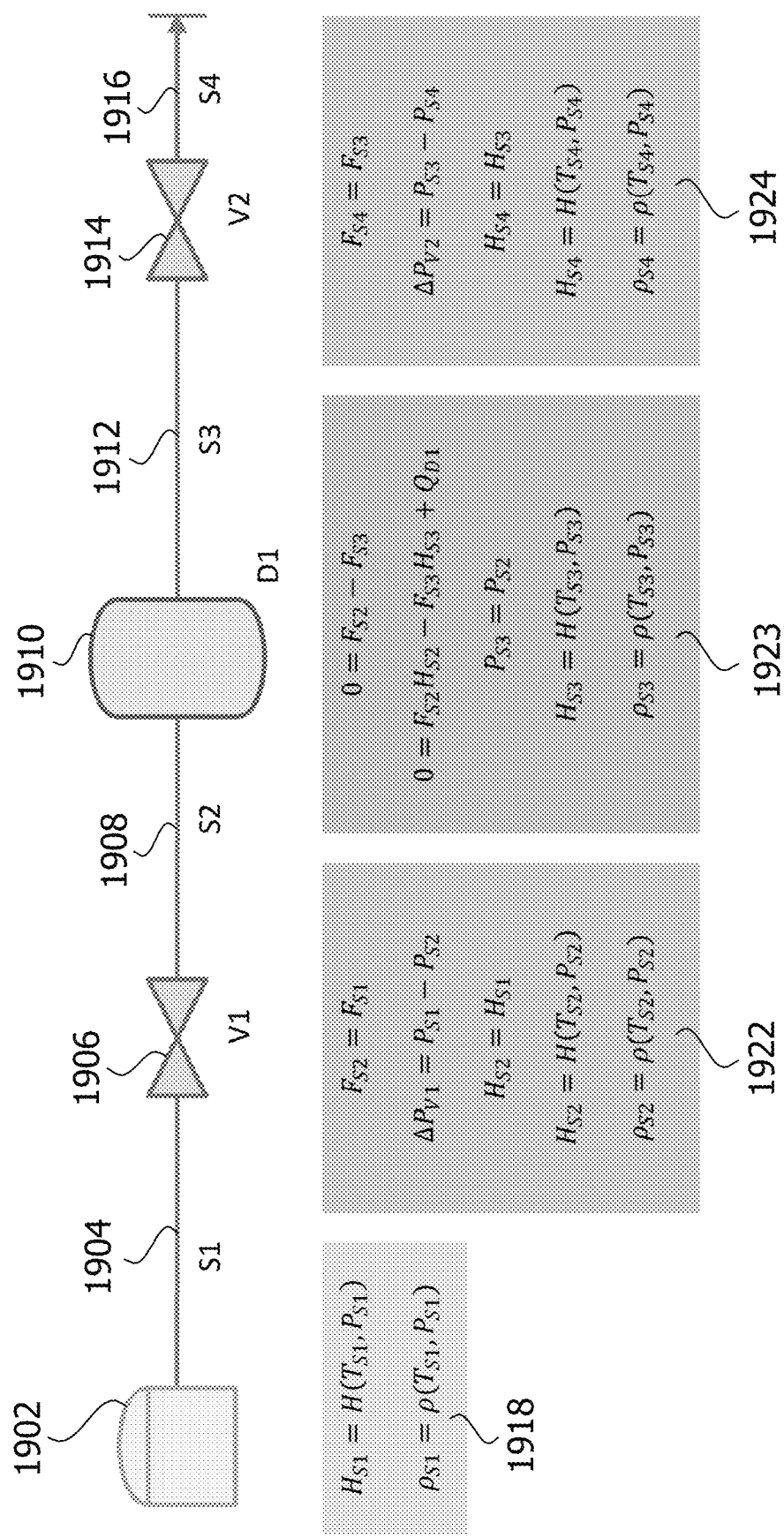
FIG. 19 is a diagram depicting an exemplary process with included sets of equations that accurately reflect the behavior of each model according to an embodiment of the invention.

FIG. 19 illustrates the above process using a diagram 1900 consisting of a Source 1902, two valves V1 1906 and V2 1914, and a drum container D1 1910. Each of the elements in connected in a line using connectors S1 1904, S2 1908, S3 1912, and S4 1916. The mathematical equations applying to the elements are created by the model developer and are shown below the icons. Equations 1918 apply to S1 1904 and the flow coming from Source 1902. The equations applied to each element of the system can be any equations that closely represent the physical behavior or characteristics of the actual device or element being represented. In the case of Equations 1918, there are two equations that represent the enthalpy (H) and the fluid density (p) of the fluid that is flowing from source 1902 through connector S1 1904. The calculation of the values is not specified in this example, but it is sufficient to know that both values are calculated as functions of the temperature (T) and the pressure (P) of the fluid.

Equation set 1922 applies to the physical functionality of the valve V1 1906. The equation set 1922 contains five equations, some similar to equation set 1918. These similar equations and equivalence equations are common when dealing with elements that are connected by a stream of fluid. Equation set 1923 applies to the physical functionality of the drum container D1 1910, and once again there are several equations present in equation set 1923 similar to previous equations sets. Equation set 1924 applies to the physical functionality of the valve V2 1914. The equation set 1924 can be seen to be nearly identical to equation set 1922, which also applies to a valve. The only differences are the connectors from which the various values are being drawn.

In a typical workflow, the user builds the simulation model first in Process Design mode. This mode is typically be used for high-level design (including mass/energy balance) and the solution is steady-state and flow-driven. The user will typically specify the flowrate for the feed stream, pressure drops across the valves, and duty for the drum.

Figure 20:
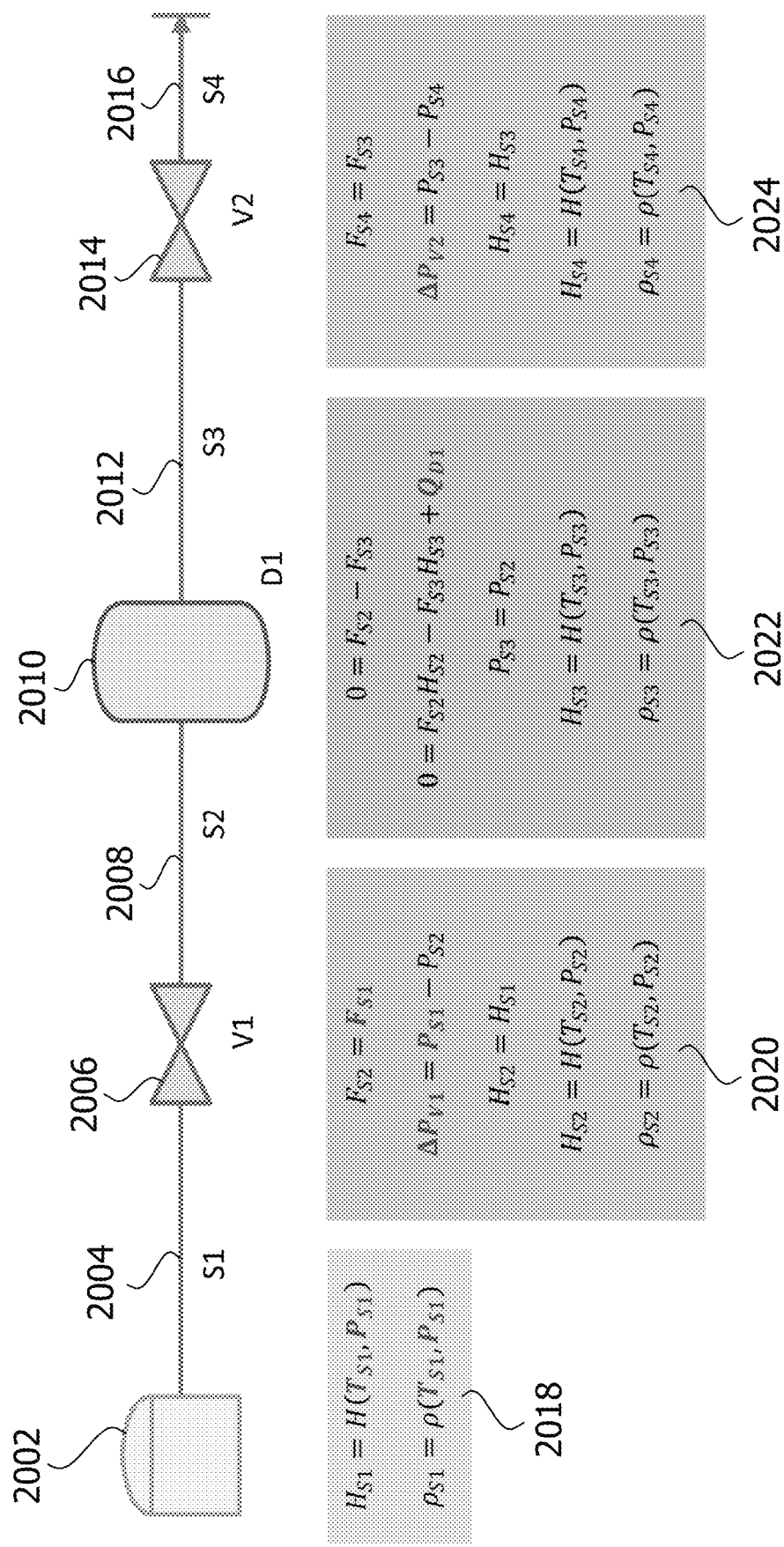
FIG. 20 is a diagram depicting the process of FIG. 19 with some of the variables highlighted that need to be specified for the system of equations to be solvable in process design mode according to an embodiment of the invention.

FIG. 20 shows the same diagram as FIG. 19 but with several of the variables in the equations bolded. The bolded variables are fixed or specified variables needed for the steady-state, flow-driven Process Design mode. There are 23 variables and only 17 equations, so six fixed variables are needed so that the number of "free" variables matches the number of equations, enabling the solver to find a solution. When the user provides values for these fixed variables the underlying solver will then be able to solve the system and generate values for the other variables. In this case, the fixed variables include the temperature of the fluid in connector S1 2004 ($T_{S1}$), the pressure of the fluid in connector S1 2004 ($P_{S1}$), the change in pressure across valve V1 2006 ($\Delta P_{V1}$), the molar flow through connector S1 2004 ($F_{S1}$), the volumetric flow through drum D1 2010 ($Q_{D1}$), and the change in pressure across valve V2 2014 ($\Delta P_{V2}$). When these variables are set to fixed values, the solver will be able to solve the equations for the rest of the unsolved variables. The solving process is described in greater detail below. Included in that process is a method for determining which variables should be fixed and which should be free.

Eventually, the user will want the simulation model to predict actual behavior and flowrates based on pressure differences. To do this requires additional variables and corresponding mathematical equations in the simulation model to represent some of the physical detail. Some of these equations are called sizing equations because they relate some physical or geometrical quantity to an operating variable.

Figure 21:
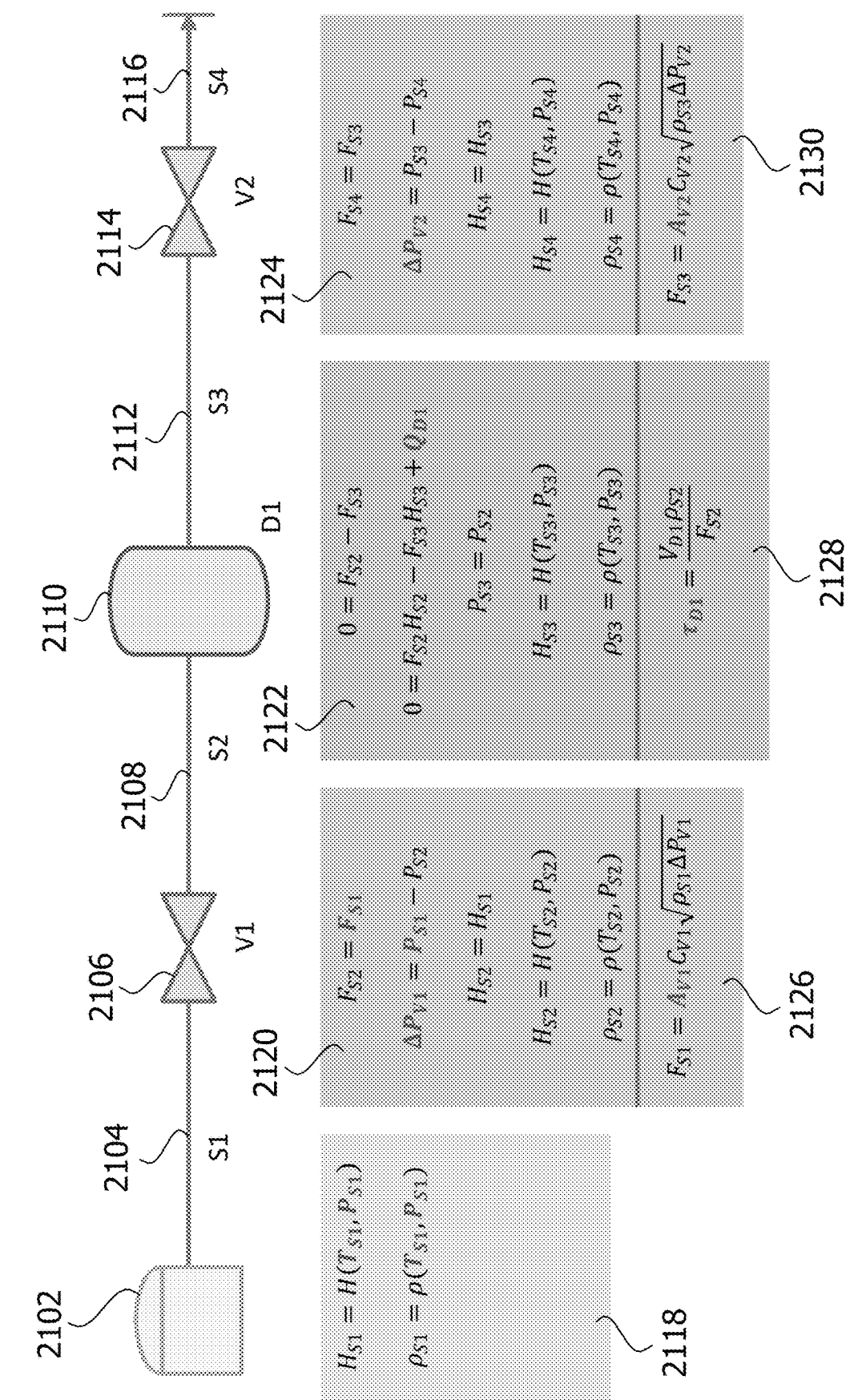
FIG. 21 is a diagram depicting the process of FIG. 20 with the inclusion of sizing equations.

These sizing equations can be seen as augmenting the original set of equations in FIG. 21. Along with the equation set 2120 for describing the behavior of valve V1 2106, an additional sizing equation 2126 has been included. With the additional equation 2126, new variables are added as well, including $A_{V1}$, which is the cross sectional area of the valve V1 2106, and $C_{V1}$, which is a sizing coefficient that stems from the size and style of valve V1 2106. Drum D1 2110 has an additional sizing equation 2128 that includes a new variable $V_{D1}$, which is the volume of the drum D1 2110, and $\tau_{D1}$ representing a residence time for fluid in the drum D1 2110. Valve V2 2114 has an additional sizing equation 2128 that includes $A_{V2}$, which is the cross sectional area of the valve V2 2114, and $C_{V2}$, which is a sizing coefficient that stems from the size and style of valve V2 2114.

The inclusion of the sizing equations adds three new equations to the total set of equations and six new variables, so three of the variables must be fixed. In this case, the cross sectional areas of the valves, $A_{V1}$ and $A_{V2}$ are fixed, as is the residence time for fluid in the drum, $\tau_{D1}$.

The simulation is still flow-driven steady-state. The additional fixed variables are used to calculate the valve constants for the valves ($C_{V1}$ and $C_{V2}$) and the volume of the drum ($V_{D1}$) based on the supplied residence time. This mode of calculating sizing variables from operating data is sometimes called sizing mode.

With some physical details now available, the mode can now be changed to Fluid Flow mode (or from sizing mode to equipment rating mode). The calculation is still steady-state, but instead of specifying the flowrate $F_{S1}$ (as was done in design mode above) the boundary pressures $P_{S1}$ and $P_{S4}$ are specified instead; $F_{S1}$ will be calculated. In addition, instead of specifying pressure drops across the valves, these can now be calculated from the valve constants. These valve constants were calculated from the previous steps, and now their values can be "fixed".

Figure 22:
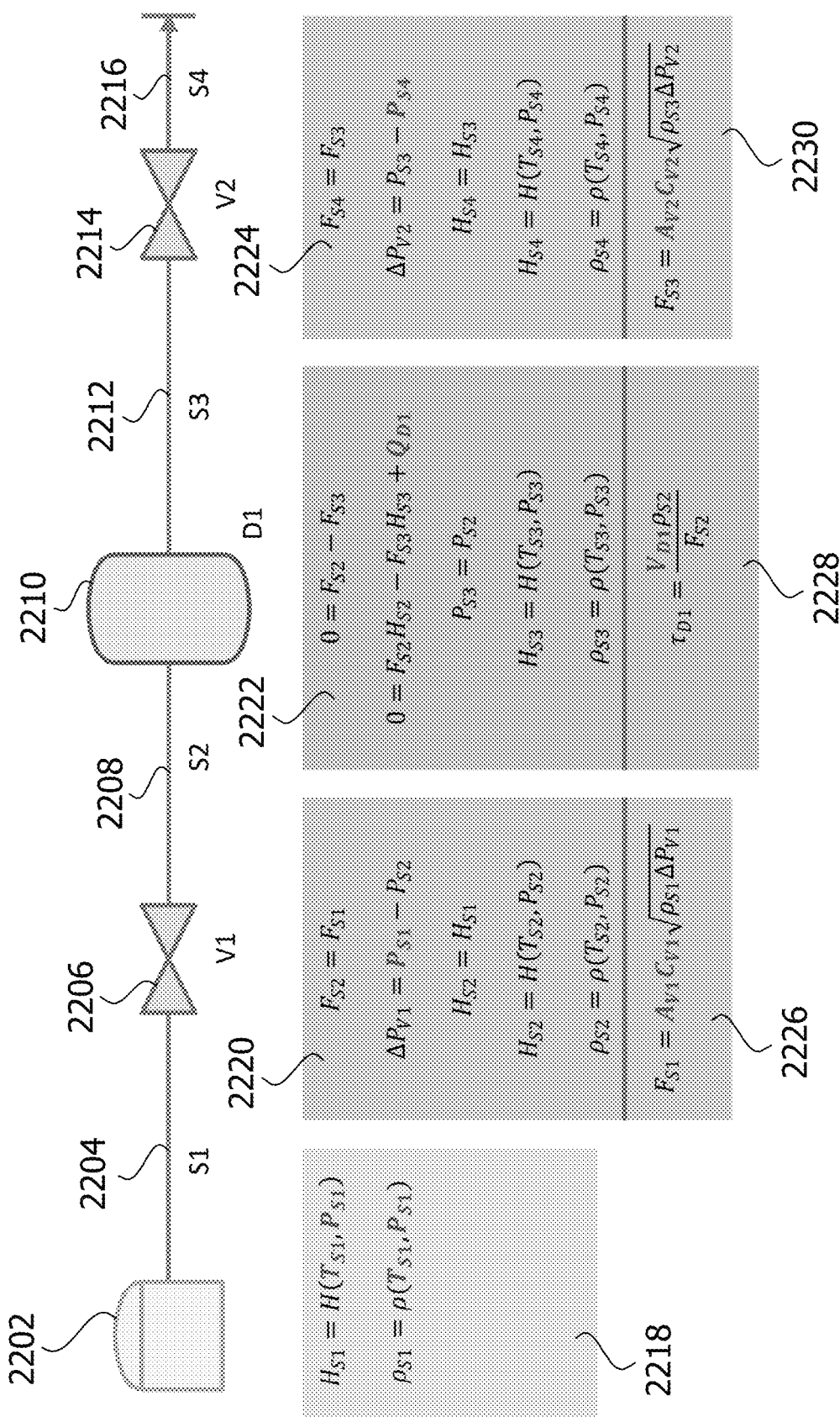
FIG. 22 is a diagram depicting the process of FIG. 20 with the specified variables changed to reflect the change in mode, which is now in fluid flow mode.

FIG. 22 shows the same system as FIG. 21, but the fixed variables have been changed to reflect the change to Fluid Flow mode. The bolded, fixed variables now include $T_{S1}$, $P_{S1}$, $A_{V1}$, $C_{V1}$, $V_{D1}$, $Q_{D1}$, $A_{V2}$, $C_{V2}$, and $P_{S4}$. In the previous mode, the valve constants ($C_{V1}$ and $C_{V2}$) were calculated, and can now be used as fixed variables to solve for other variables. In this case, the equations can be used to solve for flowrates through the connectors ($F_{S1}$, $F_{S2}$, etc.) and for the residence time of fluid in the drum D1 2210. The equations are identical; only the fix/free status of some variables has been changed.

The previous calculations have all been at steady-state. In order to prepare for dynamic simulation, an additional step may be necessary. This step involves introducing the additional equations required for dynamic simulation and then solving the equations in steady-state mode. This system has been solved at steady-state and all variables now have initial values that can be used for actual dynamic simulation. The system may calculate these initial values automatically in Fluid Flow mode so that they are always available; this would eliminate the need for an additional explicit "Dynamic Initialization" step.

Figure 23:
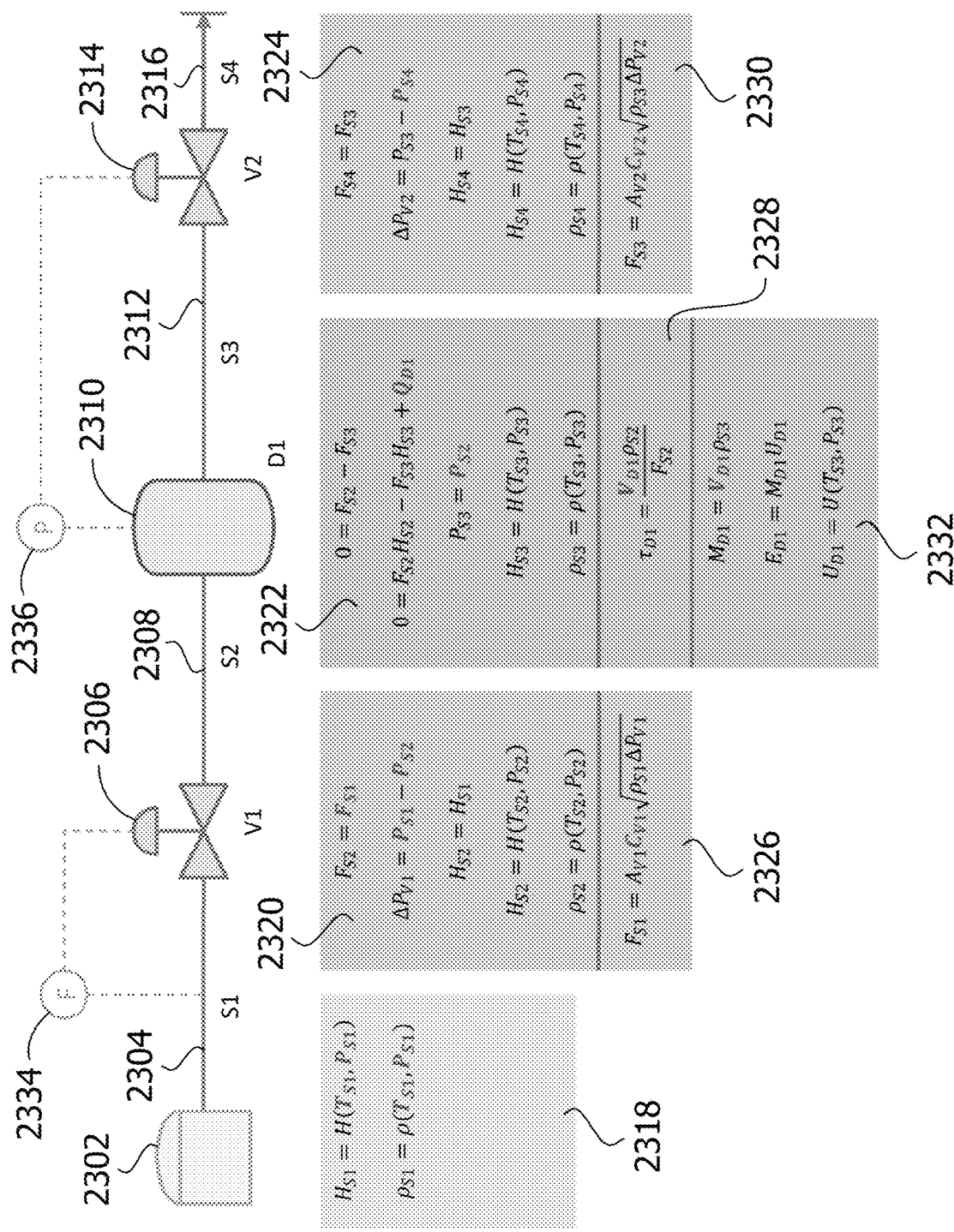
FIG. 23 is a diagram depicting the process of FIG. 20 with the specified variables changed to reflect the change in mode, which is now being initialized for dynamic mode.

FIG. 23 shows the same system as FIG. 22 but with additional equations 2332 for the "Dynamic Initialization" step. It also includes a flow device 2334 which interacts with valve V1 2306 and connector S1 2304 and a pressure device 2336 which interacts with drum D1 2310 and valve V2 2314. These two devices may use sensors to detect levels in the connector S1 2304 and drum D1 2310 and in response, open or close the valves V1 2306 and V2 2314. The new equations 2332 add three equations to the total equation set and three new variables ($M_{D1}$, $E_{D1}$, and $U_{D1}$) to the total variable set. There must still be nine fixed variables in order to solve for the remaining variables. The same variables as in FIG. 22 are fixed. The "Dynamic Initialization" step allows the system to use the known values from the steady-state calculations to determine initial values of the dynamic variables and equations. This will give the dynamic mode calculations a starting place when the system fully switches into dynamic mode.

Figure 24:
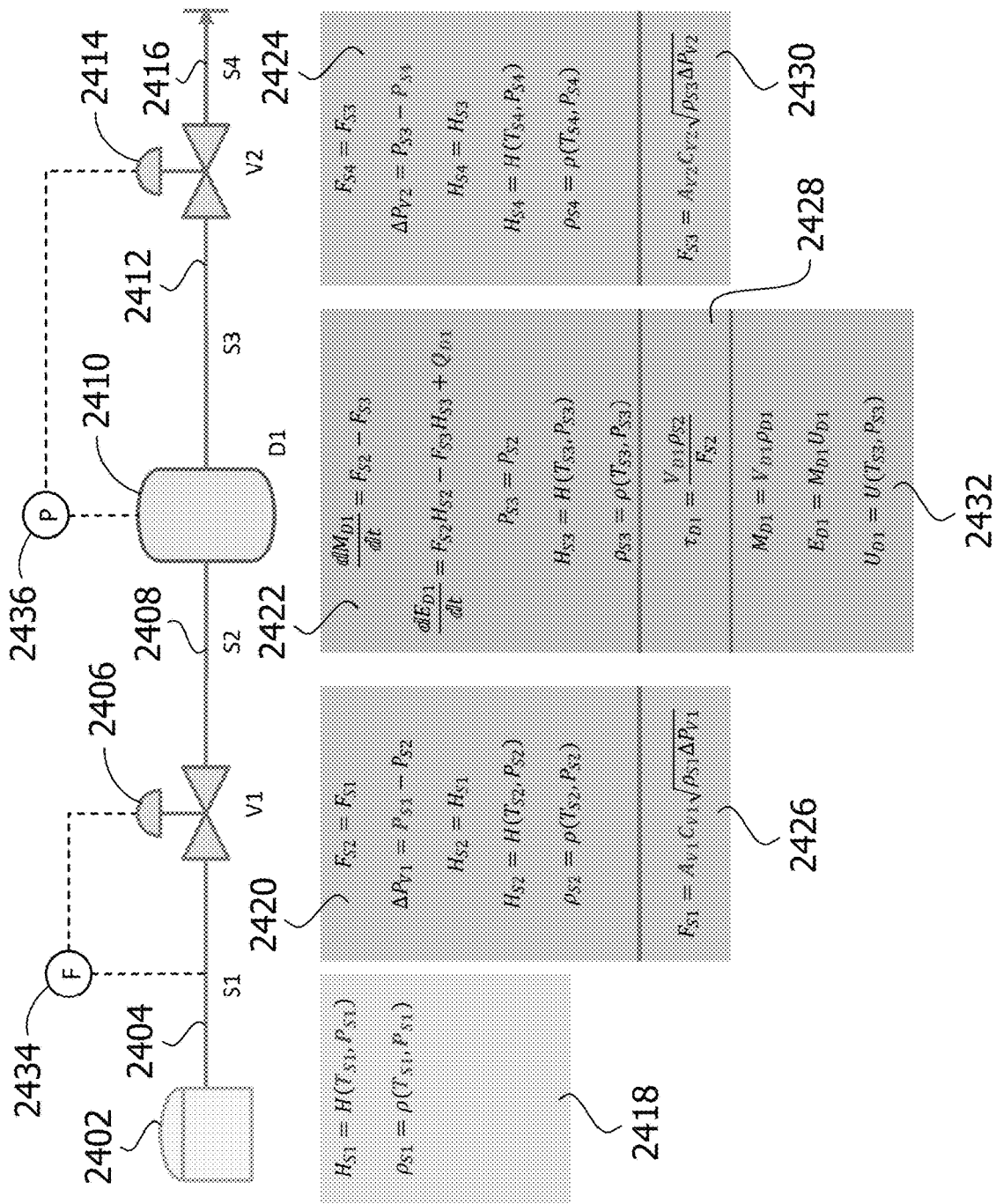
FIG. 24 is a diagram depicting the process of FIG. 20 with the specified variables changed to reflect the change in mode, which is now in dynamic mode.

FIG. 24 demonstrates the final change to full pressure-driven, dynamic simulation, which involves adding the time derivatives. In this simple system, the only addition is the holdup in drum D1 2410. Notice that the first two equations for the drum no longer equate to zero, but rather to derivative functions of $M_{D1}$ and $E_{D1}$. This change reflects that, in a dynamic simulation, the flows into and out of the drum D1 2410 will change over time. At this point, as shown in FIG. 24, a single simulation model has been converted from steady-state flow-driven to dynamic pressure driven by adding (or activating) additional equations and changing the fix/free variable settings for the participating variables. The underlying simulation equations have remained the same throughout the conversion.

At this point, some design principles can be identified. The uncontroversial principle is that the models used are written in a declarative language with control over which equations are active and which variables are defined as fixed. Equations support "categorization". For example, the simulation user should be able to turn on (or off) all "sizing equations" in one action. This implies that the actual sizing equations are categorized as such. Another potential use for "categorization" is to enable/disable the dynamic equations. If this can be done purely by analysis of the equation then this would not be required.

Parameters also allow categorization. For example, Parameters can be categorized as "design" parameters or "operating" parameters. Design parameters can be categorized as "conductance", "heat transfer", and "capacitance". This categorization can be used to consolidate queries and cross checks for entering a new simulation mode. Parameters can also be categorized as "View", "Edit", "Advanced Edit", and so on. This information can be used by the User Interface for filtering. Parameters can also be categorized into "groups". This information can be used by the User Interface for filtering and grouping. System-defined defaults for "residence time" and related quantities used for system-generated estimates are customizable. For example, a customer company may want to use a different default for their projects.

Figure 25:
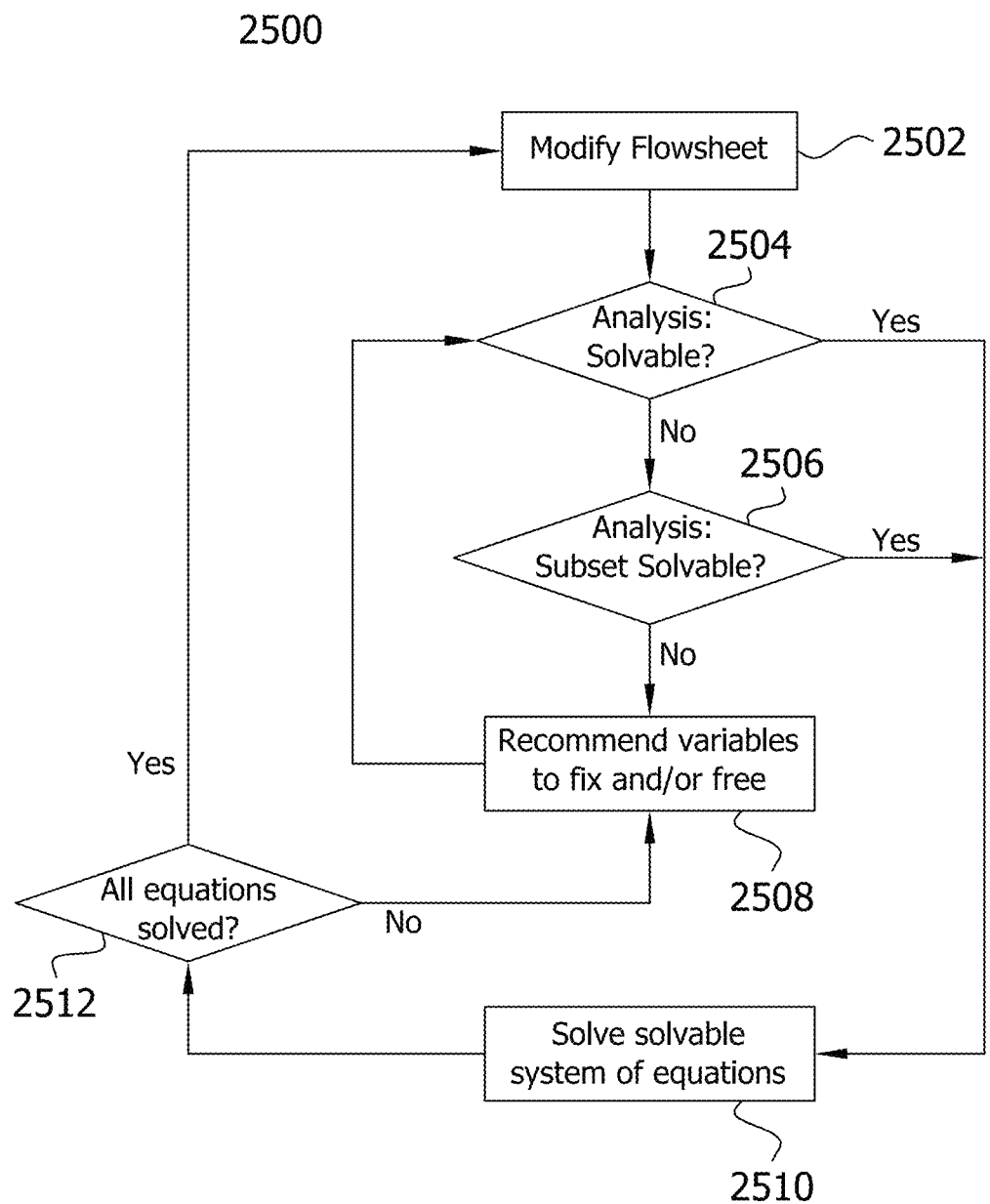
FIG. 25 is an exemplary flowchart depicting the process of analyzing and solving the system of equations and displaying solvability status to the user according to an embodiment of the invention.

Aspects of the invention related to a solving simulations feature. FIG. 25 is a flow chart describing the process of a simulation equation solving technique 2500 known as Solve on Sufficiency. Solve on Sufficiency is intended to solve the process-mode problem (the set of equations that make up the behavior of the models in the current simulation) constantly, as soon as a solvable set of equations and variables is available. After an initial solution is obtained, Solve on Sufficiency is intended to run immediately in response to any changes in the problem specification. Solve on Sufficiency follows the flowchart in FIG. 25 each time to ensure that all equations are solvable or a recommendation is made to suggest how the equations might be made solvable.

When a modification is made to a flowsheet (step 2502), the system immediately analyzes the flowsheet with respect to the modification to determine if the new flowsheet settings render the flowsheet equations solvable (step 2504). If it is found to be solvable, the system will solve all the equations (steps 2510 and 2512) and return to the beginning to wait for a new modification of the flowsheet. However, if on step 2504, the system of equations of the flowsheet is not found to be solvable, the system will determine if a subset of the equations are solvable (step 2506). If not, the system moves on to step 2508 and recommends variables in the system that the user should fix at certain values or free to allow the system to solve for them. For instance, if the system of equations is not solvable because there are more variables to solve for than there are equations, the system may recommend that the user set one or more variables to fixed points so that the system can use the equations to solve for the remaining variables. However, if some variables have been fixed in such a way as to render the equations unsolvable, the system may recommend that one or more fixed variables be freed in order to enable the system to solve for the free variables without conflict.

Once the recommendations have been made and the user has fixed or freed one or more variables, the system goes back to step 2504 to determine if the system of equations is solvable for the current variable set. If so, the system will execute steps 2510 and 2512 and return to the beginning of the flowchart. If not, the system returns to step 2506 to determine if a subset of equations/variables are solvable. If so, the system proceeds to step 2510 to solve the solvable subset of equations. In step 2512, the system would determine that not all of the equations have been solved yet and the system would move on to step 2508, suggesting the user fix or free one or more variables. Once again, the system would then analyze the equations for solvability after the one or more variables have been fixed or freed by the user. This loop will continue until the system can satisfactorily solve all of the equations and does so, returning to the beginning of the flowchart. This process occurs on every modification of a flowsheet in order to ensure that the flowsheet being built is a useful representation of a solvable simulation.

The variables in the problem will have a "fixed/specified" or "free/calculated" attribute attached to them. If they are "fixed", they will have a numerical value in the corresponding UOM. Some variables may have upper and/or lower bounds defined on them. In process engineering problems, the variables are normally all continuous, but discontinuities should be expected. The equations can be linear or nonlinear. Process engineering model equations are normally sparsely populated. They also possess a natural block-diagonal quality, especially if the equations arising from each model are preserved in relative position. This will be explained in more detail later.

The process-mode/steady-state problem is to find the values of the "free" variables so that every equation evaluates to zero residual or within a small tolerance. This can also be interpreted as solving a model for its outputs, given its inputs. The system focuses on a particular solving method using Solve on Sufficiency.

For example, upon instantiation of a "Sum" model in the flowsheet (assuming that it is the first model being instantiated), the client is presented with the following closed-form equation:

$$C = A + B \quad (1)$$

Within the simulator, equations can also be represented in open-form (or "residual form") as follows:

$$A + B - C = 0 \quad (2)$$

In the Solve on Sufficiency paradigm, this equation should be solved immediately. However, note that there is infinity of solutions to (1) or (2). The problem must be constrained sufficiently, so that there is a unique solution arising from (1) or (2).

The closed-form expression (1) is helpful in understanding the information flow. If A and B are specified (or "fixed", or "input"), then C (the "free" variable, or "output") is uniquely determined. The open-form equation (2) encapsulates the relationship between the three variables and is flexible in terms of what variables can be fixed and what variables can be free. For example, B and C can be "fixed", while the "free" variable A is computed (solved) to satisfy (2). Similarly, A and C can be fixed while B is "free" to be solved to satisfy (2). The final permutation is A and B can be fixed while C is free to be solved to satisfy (2). Table 1 illustrates these combinations Fixed and Free Variables for the Sum model.

TABLE 1

| Fixed variable | Fixed Variable | Free Variable |
|---|---|---|
| A | B | C |
| A | C | B |
| B | C | A |

In this example, two variables need to be fixed to get a unique answer. This is related to the notion of degrees of freedom. Degrees of freedom can be defined as the difference between the total number of variables in the system and the total number of equations describing the system. Thus in the above example, there are 3−1=2 degrees of freedom. When there are positive non-zero degrees of freedom, it implies that the system of equations may have infinity of solutions. A minimum number of variables must be specified (as fixed) so that there is a unique solution to the system of equations. The number of variables to specify as "fixed" is equal to the degrees of freedom. The variables that are not fixed are considered as free. Certain algorithms can be used to identify variables that should be fixed or free.

In order to provide Solve on Sufficiency functionality, the following high level tasks need to be performed:
  i. Gather the equations and variables in the currently defined context.
  ii. Ensure that there is a solvable set of equations via the recommendation of appropriate fixed and free variables.
  iii. Apply algorithms that allow re-arranging of the equations and variables, so that a lower triangular structure (see equation-variable grids below) can be realized, as close as possible. Such algorithms would take into account the cost of tearing some variables.
  iv. Group block-sets of equations as follows: (a) singletons; (b) duals; (c) triads; (d) larger sets.
  v. Further group each along linear or nonlinear sets. If linear, note that the system only needs to do Lower Upper (LU) factorization once.
  vi. Define two solution mechanisms: (a) Gauss (explained later)—which is amenable to strong parallelization; (b) Gauss-Seidel (explained later)—which normally converges faster, but is more difficult to parallelize, which would operate on linear or nonlinear sub-problems.
  vii. Use efficiency heuristics that would speed up subsequent solve on sufficiency cycles.

Solvability analysis is required to identify structural singularity, if any. Solvability is also the process of identifying fixed variables. Graph analysis methods are normally used to identify equation-variable pairs, so that the remaining variables can be classified as fixed variables. In the described application, the user will identify some variables as fixed variables. In such cases, analysis algorithms are used to ensure that such specifications do not cause false structural singularity, and in the event that they do flag such singularity, the algorithms guide the user on what variables to free up so that the system is solvable. Additional analysis algorithms look for "over-specification". If the user specifies too many variables or the wrong variables, it may no longer be solvable and the algorithms identify the problem and guide the user to free some of the variables. The system will also guide the user to setting fixed variables in the event that an insufficient number of variables have been fixed. If there are not enough fixed variables, the system of equations will possibly have more than one solution, and the system will be unable to solve for the free variables.

Symbolic analysis is required to analyze the system of equations, and obtain row and column permutations so that a lower triangular structure emerges (see the incidence matrices below). In doing so, tear variables also emerge. Tear variables appear above and to the right of the diagonal of the triangle structure and cannot be solved for in the same manner as the variables within the triangle structure. A lower triangular structure is critical to obtaining an inexpensive solution sequence that side-steps the need for a large simultaneous solution. There exist several algorithms to perform such triangularization. A well-known graph algorithm used for the purpose is the Dulmage & Mendelsohn algorithm for maximal matching on a bipartite graph. Algorithms for triangularization should ideally be able to obtain maximal matching, minimizing the number of tear variables, be able to accommodate the quality of the tear streams in the analysis (the minimal set of tear variables may have high sensitivity, and confer poor convergence properties; the algorithms used must understand the cost of poor convergence), and be able to get tear variables close to 2×2 or 3×3 blocks, so that a poorly reconvergent stream can be absorbed in a higher-order block easily. Ideally, a system of equations will be reordered into a perfect lower triangle structure with all 1×1 blocks. This would result in sequentially calculating for each variable in a linear manner. Other blocks, like 2×2 or 3×3 may require simultaneous calculation, which is not as efficient as sequential calculation.

The lower triangular structure provides the solver with the sub problems that can be solved. These can be 1×1 blocks, or 2×2 blocks, or 3×3 blocks, or higher blocks. In the event that convergence is hard to come by, (because of the presence of tear variables that are treated an iteration-step behind the variables being iterated upon) the solver should be able to identify and dynamically group larger sets of equations for simultaneous solution. In the ultimate limiting case, the entire set will be solved as one big set of equations.

The solver is able to identify larger blocks as linear or nonlinear. The solver can cluster/group sections of linear equations together, if possible, so that it can do one Lower Upper (LU) Decomposition at the start of a solve on sufficiency, and keep the decomposition for all subsequent solutions for efficiency purposes, until such time the structure changes.

After successful triangularization, the solver will have a sequence of linear and nonlinear blocks where the variables obtained in the upstream solution sequence flows down the block-triangular structure. When the solver encounters a tear variable, it uses the old value (one iteration-step behind) of such variables, until such time the variable is updated in the triangular structure.

As understood by one of ordinary skill in the art, the Gauss paradigm requires that at the current iteration, old variable values be used to update to the new variable values. However, the newly computed variable values are not used in the triangle-cascade for that iteration. Instead, the new values are used at the start of the next iteration cycle. Such a separation in iteration of the data-flow computation allows parallelism to a very high degree, because all blocks are fully specified in terms of their old values and block-structure, and can independently obtain the new value of the variables that each block is "responsible" for. The downside of Gauss paradigm is a reduced convergence rate sometimes in relation to Gauss-Seidel.

The Gauss-Seidel paradigm requires that as soon as a variable is updated during the triangular navigation, it is used immediately in the subsequent calculations during that iteration itself. Sometimes it makes sense to use such a paradigm; if the solver has an updated variable value, why not use it to get better values of variables downstream in the triangular-cascade? This can sometimes give a faster convergence rate. The downside of this is that it offers less scope for parallelism.

The various functional steps in the operation of the analyzer are outlined in this section with a summary of the interface requirements for input data and output data. Each step in the process should be designed with an appropriate code interface so that different implementations can be exchanged without extensive re-coding.

Referring first to generating equations for analysis (flattening), the first step in analysis is to convert the editable simulation structure (flowsheets, model instances) into a set of numerical equations. This is done by starting at the top level root flowsheet and recursively replacing each model instance with the equations it introduces to the system. Since model types in the library may be parameterized, the process of equation generation involves applying current values of parameters, such as the number of thermo components in use, or the conditional inclusion of a sub-model such as a heat loss calculation or compressor head-flow curve. This naturally means that changing a configuration parameter may change the number and type of equations in the system while keeping the same flowsheet topology.

There is a transformation from the "edit" space to the "solver" space. For example a variable in the editable database may be a rich data structure with many attributes including value, whereas a variable in the solver environment may be a simple double stored in an array for efficient access.

Referring now to partitioning equations into solvable and unsolvable, before any attempt can be made to solve the equations generated from the model they must be checked for consistency and valid specification. Specification problems may include groups of equations that have too many unknown variables for solution ("underspecified") or groups of equations that have too few variables for solution ("over specified"). Both situations may occur at the same time. It is natural for incomplete specifications to occur as a simulation is being constructed and the goal of this step is to ensure the system does not try to solve equations that are not yet ready for solution. Solvable and unsolvable equations follow separate paths in the following steps.

In technical terms this process is known to those skilled in the art as a coarse Dulmage-Mendelsohn decomposition. It separates equations into solvable and unsolvable, and gives information about the under or over specified status of the unsolvable equations. Some post processing is required after the Dulmage-Mendelsohn decomposition to extract the exact information needed.

The input to this step is the "incidence matrix", the complete list of equations in the simulation and the record of which unknown variables appear in which equations. The output consists of two separate lists of equations, those which are solvable (maybe none) and those which are unsolvable (should be none when the simulation is properly specified). When there are unsolvable equations the output contains two sub-lists of equations and variables giving more information about the problem: equations and variables forming a smallest underspecified group and equations and variables forming a smallest over specified group.

Fixing any free variable in the underspecified group will improve the specification of the system, while freeing up any fixed variable from the equations in over specified group will also improve the specification of the system. For illustration, consider the following system as shown in Table 2, below:

TABLE 2

| | | Variables | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Equations | 1 | | | | | | X | | | | | |
| | 2 | X | | X | | | | X | | | X | |
| | 3 | X | | | | | | X | | | | |
| | 4 | | | | | | X | | | | | |
| | 5 | | X | | | X | X | X | | | X | |
| | 6 | | X | | | | | | X | X | | X |
| | 7 | | | | | | | | | | | |

TABLE 2-continued

| | Variables | | | | | | | | | | |
|---|---|---|---|---|---|---|---|---|---|---|---|
| | 1 | 2 | 3 | 4 | 5 | 6 | 7 | 8 | 9 | 10 | 11 |
| 8 | | X | X | X | X | | | | | X | X |
| 9 | | X | | | | | | | X | | |
| 10 | | | | | | | | X | | | |
| 11 | X | | | | | | X | | | | |
| 12 | | | | | X | X | | | | | |

Figures 27, 28:
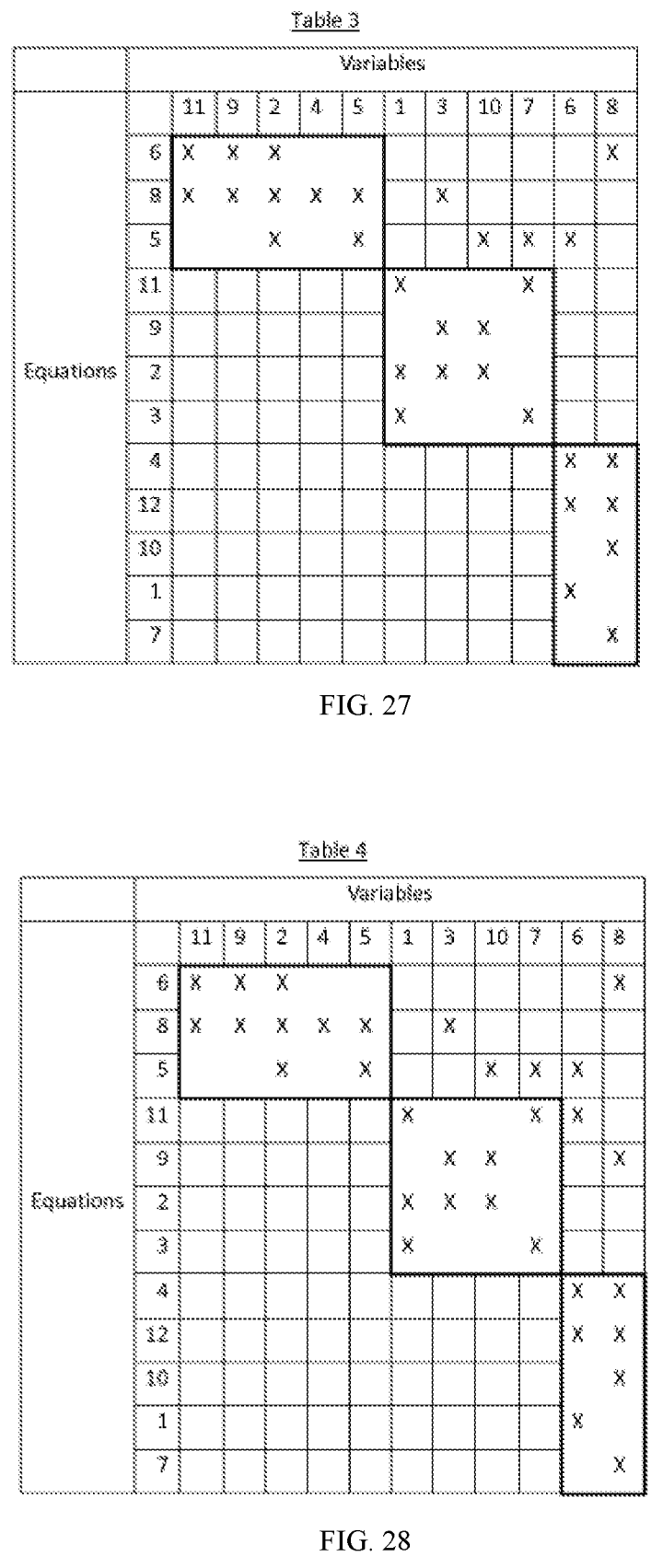

Applying the Dulmage-Mendelsohn decomposition to this system produces this result as shown in FIG. 27.

This shows that equations 2, 3, 9, 11 are well specified with respect to variables 1, 3, 10, and 7 as shown in the middle block and can proceed to solution, while the other equations 6, 8, and 5 and the other equations 4, 12, 10, 1, and 7 need specification changes before they can be solved. The left block for equations 6, 8, and 5 is under specified and the right block for equations 4, 12, 10, 1, and 7 is over specified. Next, consider a small modification to the above example so that the decomposition looks like this as shown in FIG. 28.

Note how variables 6 and 8 now appear in equations 9 and 11 in the middle block. This means that equations 9 and 11 cannot actually be solved since variables 6 and 8 are over determined. In reality the interpretation should be as shown in FIG. 29.

This means that there are no solvable equations at all in this system. This result is arrived at by crossing out equations 9 and 11, and then crossing out all variables involved in those two equations, which results in crossing out all of the variables.

According to an embodiment of the invention, the simulation program identifies unsolvable steps. In the prior step, the equations in the system were partitioned into solvable and unsolvable groups. The equations in the unsolvable groups (left and right blocks of Tables 3 and 4 and both blocks of Table 5 above) now follow a different path from the solvable equations. They cannot be solved right away, so the system must guide the user to make them solvable.

Preferably, in every case where unsolvable equations exist the system advises on specification changes to bring all the equations into the solvable group. The system does this by highlighting fixed, specified variables that may be freed, or free, calculated variables that may be specified. If the user makes any single recommended change it will improve the system overall, and since our user can only make one change at a time the system will repeat the analysis after each specification change and guide the user until the whole system becomes solvable.

Considering the current example, the advice given to the user would be that any variables among 2, 4, 5, 9 or 11 are candidates for specifying (fixing), and any fixed variables appearing in equations 1, 4, 7, 10 or 12 are candidates for freeing.

One special case exists where all variables are fixed in an equation and therefore such an equation has no free variables and will drop out of the analysis. In this case it is simply necessary to advise on freeing any of the fixed variables in such an equation in order to bring it into play.

Further, the simulation program of this embodiment addresses solvable steps. Every simulation will contain many link equations and connection equations of the form x=y. These are redundant from a solution perspective and can be eliminated from the problem presented to the solver. To do this efficiently, the solver lets x and y be represented by the same solver variable and arrange that the names "x" and "y" both refer to the same storage. Special consideration must be given to cases where one of x or y are specified (the other variable vanishes completely), or when x and y have different min and max values (perhaps the most constraining min and max between both should be used).

When a problem is first presented to the solver it may look as if it is a large set of simultaneous equations. Consider for example the system shown in Table 6, below:

TABLE 6

| | | Variables | | | | | | | | | |
|---|---|---|---|---|---|---|---|---|---|---|---|
| | | 1 | 2 | 3 | 4 | 5 | 6 | 7 | 8 | 9 | 10 |
| Equations | 1 | X | | | | | | X | X | | X |
| | 2 | X | X | X | X | | X | X | X | | X |
| | 3 | | | X | | | | X | | | |
| | 4 | X | X | X | X | | | X | X | | |
| | 5 | X | X | X | X | | | X | X | X | |
| | 6 | | X | X | X | | X | X | X | | X |
| | 7 | | | X | | | | X | | | |
| | 8 | X | | | | | | X | X | | X |
| | 9 | X | X | X | X | X | X | | X | X | X |
| | 10 | X | | X | | | | | | | X |

When this system is presented to the partitioning step, the result is as shown in FIG. 30.

The system is square and potentially solvable since it has entries all along the leading diagonal. However, a further sequence of row and column permutations can reduce the system to the form shown in FIG. 31.

Instead of one large block, the problem has been reduced to the sequential solution of five smaller blocks. This results in increased robustness, faster solution and reduced memory usage. This operation follows on naturally from the Dulmage-Mendelsohn partitioning step and is known variously as reduction to block lower triangular form or the fine decomposition of Dulmage-Mendelsohn. A commonly known efficient algorithm for this is Tarjan's algorithm. The solver uses this operation to extract the inherently sequential nature of many simulation problems.

Dynamic simulation according to an embodiment of the invention requires a differential equation solver, or more precisely a differential-algebraic equation solver (DAE solver). Such a solver is built on the principles of the steady state solver and uses all of the same elements.

Analysis (and solution) proceeds by transforming the differential equations into algebraic equations and then following the same path as in the earlier sections. There is a small variation to account for state variables and time derivatives, but this is easily incorporated.

Figure 26:
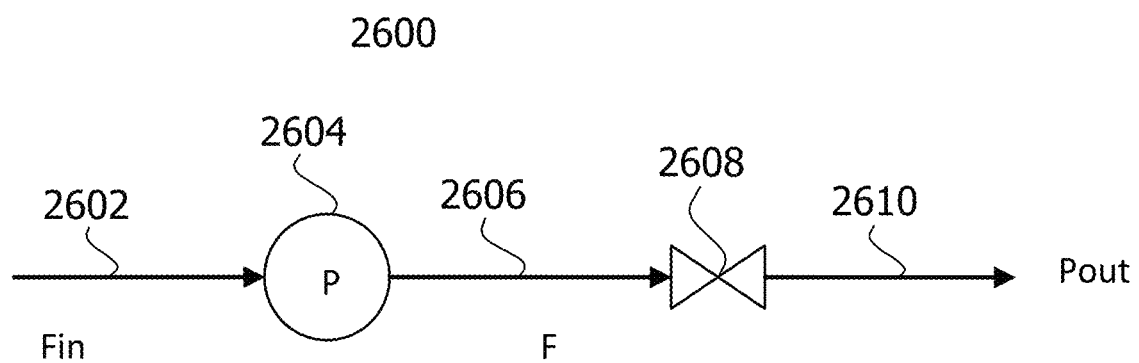
FIG. 26 is a diagram depicting an exemplary system diagram comprising basic process elements.

The process is probably best explained by example. FIG. 26 shows a simple system diagram 2600 for use with the following example explanation. The diagram 2600 consists of a flow input 2602, a pressure node 2604, a second flow 2606, a valve 2608, and an output 2610. Simple equations can be written for use in describing the analysis principles:

For the pressure node 2604:

$$der(M)=F\text{in}-F$$

$$P*V=M*R*T$$

$$rho*V=M$$

For the valve 2608:

$$Q*rho=F$$

$$Q=K*\text{sqrt}(P-P\text{out})$$

For the example, Fin, V, R, T, K & Pout are fixed to certain values. That leaves five equations in the five unknown variables M, F, P, Q & rho.

In steady state, all time derivatives are zero, so der(M) is set to zero. The incidence matrix looks as shown in Table 9, below:

TABLE 9

|  |  | Variables | | | | |
|---|---|---|---|---|---|---|
|  |  | 1 | 2 | 3 | 4 | 5 |
| Equations | 1 |  | X |  |  |  |
|  | 2 | X |  | X |  |  |
|  | 3 | X |  |  |  | X |
|  | 4 |  | X |  | X | X |
|  | 5 |  |  | X | X |  |

After re-ordering the rows and columns for solution the matrix are as shown in FIG. 32.

The solver can solve for F=Fin, but after that it must solve the remaining four equations simultaneously.

For dynamic simulation in accordance with aspects of the invention, the solver needs a way to evaluate the der(M) function. This is done by adding a new variable dMdt to hold the time derivative, and then introducing a system defined equation to evaluate this derivative. The result is like this:

For the pressure node 2604:

$$dMdt = Fin - F$$

$$P*V = M*R*T$$

$$rho*V = M$$

For the valve 2608:

$$Q*rho = F$$

$$Q = K*\text{sqrt}(P - Pout)$$

Extra time derivative equation for each state variable:

$$dMdt = (M - M0)/dt$$

The function der(M) is replaced internally with the value of dMdt, and then dMdt is defined by an equation that the system generates according to the kind of integrator in use. In the example above a simple backward difference is used for implicit Euler. The quantity M0 is the value of M from the previous time step (the system accounts for this internally and does not display it to the user).

Applying der(M) to the variable M turns M into a state variable. In Dynamic mode the system cannot allow state variables to be specified by the user or it will be impossible to integrate them. Therefore no check box must be shown next to M or dMdt. These values are always calculated.

In an embodiment, dMdt is included as variable 6 and the new equation as equation 6. The incidence matrix is as follows in Table 11:

TABLE 11

|  |  | Variables | | | | | |
|---|---|---|---|---|---|---|---|
|  |  | 1 | 2 | 3 | 4 | 5 | 6 |
| Equations | 1 |  | X |  |  |  | X |
|  | 2 | X |  | X |  |  |  |
|  | 3 | X |  |  |  | X |  |
|  | 4 |  | X |  | X | X |  |
|  | 5 |  |  | X | X |  |  |
|  | 6 | X |  |  |  |  | X |

When analysis is applied to the equations, the result is shown in FIG. 33.

In this example, all equations need to be solved simultaneously. This is typical of implicit integration methods; they tend to cause large simultaneous blocks of equations.

Referring now to a Solver feature of the present invention, once the analysis is complete the numerical integrator can be applied to the system. The process follows the following steps:

i. Set the initial values of all variables at time zero to the steady state solution
ii. Advance time by one time step
iii. Fix M0 at the value from the previous time step
iv. Solve the equation set for new values of the algebraic variables and the state(s)
v. Return to step ii and repeat The process of solving the equation set in step iv will use the same simultaneous equation solver as described in the Unsolvable Steps section.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

Having described aspects of the invention in detail, it will be apparent that modifications and variations are possible without departing from the scope of aspects of the invention as defined in the appended claims. It is contemplated that various changes could be made in the above constructions, products, and process without departing from the scope of aspects of the invention. In the preceding specification, various preferred embodiments have been described with reference to the accompanying drawings. It will, however, be evident that various modifications and changes may be made thereto, and additional embodiments may be implemented, without departing from the broader scope of the aspects of the invention as set forth in the claims that follow. The specification and drawings are accordingly to be regarded in an illustrative rather than restrictive sense.

What is claimed is:

1. A system for simulating a process entity in an industrial process, the system comprising:
   a processor;
   a memory device coupled to the processor;
   software instructions stored on the memory device and executable by the processor, said instructions comprising:
      instructions for presenting a plurality of model editors on a respective plurality of remote processing devices, wherein the remote processing devices are coupled to the system via a communications network, and wherein each of the remote processing devices is associated with a user;
      instructions for creating, via the model editors, a plurality of standard entity type objects in response to user input from one or more of the remote processing devices, said standard entity type objects each generically representing a type of process entity in the industrial process, wherein one or more of the standard entity type objects are customizable;
      instructions for creating, via the model editors, a plurality of custom entity type objects in response to user input from one or more of the remote processing devices, wherein the custom entity type objects are specific to the users associated with the remote processing devices;
      instructions for storing the standard entity type objects in a pre-existing default model library of a shared repository stored on a shared server;
      instructions for creating a custom model library in the shared repository;
      instructions for storing the custom entity type objects in the custom model library;
      instructions for enabling the remote processing devices to access the standard entity type objects in the default model library of the shared repository simultaneously;
      instructions for enabling the remote processing devices to access the custom entity type objects in the custom model library of the shared repository simultaneously;
      instructions for changing, via the model editors, at least one of the custom entity objects in response to user input from one or more of the remote processing devices; and
      instructions for persisting, in the custom model library of the shared repository, changes made to the custom entity type objects by any of the users associated with the remote processing devices.

2. The system of claim 1, wherein the remote processing devices are enabled to access the custom entity type objects from a plurality of geographical locations, wherein at least one of the remote processing devices is located at a first geographical location of the plurality of geographical locations and at least one of the remote processing devices is located at a second geographical location of the plurality of geographical locations that is different from the first geographical location.

3. The system of claim 1, further comprising instructions for storing the changes made to the custom entity type objects in the custom model library of the shared repository for use by the users associated with the remote processing devices, wherein the changes are made in response to user input from one or more of the remote processing devices.

4. The system of claim 1, wherein storing the custom entity type objects comprises importing an externally created custom entity type object into the custom model library of the shared repository.

5. The system of claim 1, further comprising instructions for storing one or more simulations in the shared repository, said simulations comprising flowsheets and one or more instances of the standard entity type objects and custom entity type objects, wherein the simulations are stored separately from the default model library and the custom model library in the shared repository.

6. The system of claim 5, further comprising instructions for saving a snapshot of a simulation stored in the shared repository, said snapshot representing an archive of a simulation.

7. The system of claim 5, wherein each simulation includes an internal model library stored in the shared repository, wherein each internal model library includes custom entity type objects private to the simulation.

8. The system of claim 5, wherein changes made to instances of the standard entity type objects in one simulation are propagated to instances of the standard entity type objects in other simulations.

9. One or more tangible, non-transitory computer-readable media having executable instructions stored thereon that, when executed, perform a method of simulating a process entity in an industrial process, the method comprising:
presenting a plurality of model editors on a respective plurality of remote processing devices, wherein the remote processing devices are coupled to the system via a communications network, and wherein each of the remote processing devices is associated with a user;
creating, via the model editors, a plurality of standard entity type objects in response to user input from one or more of the remote processing devices, said standard entity type objects generically representing a type of process entity in the industrial process, wherein one or more of the standard entity type objects are customizable;
creating, via the model editors, a plurality of custom entity type objects in response to user input from one or more of the remote processing devices, wherein the custom entity type objects are specific to the users associated with the subset of remote processing devices;
storing the standard entity type objects in a pre-existing default model library of a shared repository stored on a shared server;
creating a custom model library in the shared repository;
storing the custom entity type objects in the custom model library;
enabling the remote processing devices to access the standard entity type objects in the default model library of the shared repository simultaneously;
enabling the remote processing devices to access the custom entity type objects in the custom model library of the shared repository simultaneously;
changing, via the model editors, at least one of the custom entity objects in response to user input from one or more of the remote processing devices; and
persisting, in the custom model library of the shared repository, changes made to the custom entity type objects by any of the users associated with the remote processing devices.

10. The computer-readable media of claim 9, wherein the remote processing devices are enabled to access the custom entity type objects from a plurality of locations.

11. The computer-readable media of claim 9, wherein the method further comprises storing the changes made to the custom entity type objects in the custom model library of the shared repository for use by another of the users associated with the remote processing devices.

12. The computer-readable media of claim 9, wherein storing the custom entity type objects comprises importing an externally created custom entity type object into the custom model library of the shared repository.

13. The computer-readable media of claim 9, further comprising storing one or more simulations in the shared repository, said simulations comprising flowsheets and one or more instances of the standard entity type objects and custom entity type objects, wherein the simulations are stored separately from the default model library and the custom model library in the shared repository.

14. The computer-readable media of claim 13, wherein the method further comprises saving a snapshot of a simulation stored in the shared repository, said snapshot representing an archive of a simulation.

15. A processor executable method of simulating a process entity in an industrial process, the method comprising:
presenting a plurality of model editors on a respective plurality of remote processing devices, wherein the remote processing devices are coupled to the system via a communications network, and wherein each of the remote processing devices is associated with a user;
creating, via the model editors, a plurality of standard entity type objects in response to user input from one or more of the remote processing devices, said standard entity type objects generically representing a type of process entity in the industrial process, wherein one or more of the standard entity type objects are customizable;
creating, via the model editors, a plurality of custom entity type objects in response to user input from one or more of the remote processing devices, wherein the custom entity type objects are specific to the users associated with the remote processing devices;
storing the standard entity type objects in a pre-existing default model library of a shared repository stored on a shared server;
creating a custom model library in the shared repository;
storing the custom entity type objects in the custom model library;
enabling the remote processing devices to access the standard entity type objects in the default model library of the shared repository simultaneously;
enabling the remote processing devices to access the custom entity type objects in the custom model library of the shared repository simultaneously;
changing, via the model editors, at least one of the custom entity objects in response to user input from one or more of the remote processing devices; and
persisting, in the custom model library of the shared repository, changes made to the custom entity type objects by any of the users associated with the remote processing devices.

16. The method of claim 15, wherein the remote processing devices are enabled to access the custom entity type objects from a plurality of locations.

17. The method of claim 15, further comprising storing the changes made to the custom entity type objects in the custom model library of the shared repository for use by another of the users associated with the remote processing devices.

18. The method of claim 15, wherein storing the one or more custom entity type objects comprises importing an externally created custom entity type object into the custom model library of the shared repository.

19. The method of claim 15, further comprising storing one or more simulations in the shared repository, said simulations comprising flowsheets and one or more instances of the standard entity type objects and custom entity type objects, wherein the simulations are stored separately from the default model library and the custom model library in the shared repository.

20. The method of claim 19, further comprising saving a snapshot of a simulation stored in the shared repository, said snapshot representing an archive of a simulation.

\* \* \* \* \*